US012792387B2

(12) United States Patent
Huntley et al.

(10) Patent No.: US 12,792,387 B2
(45) Date of Patent: Nov. 10, 2026

(54) APERTURE ACCESS PROCESSORS, METHODS, SYSTEMS, AND INSTRUCTIONS

(71) Applicant: INTEL PRODUCTS IP LLC, Santa Clara, CA (US)

(72) Inventors: Barry E. Huntley, Hillsboro, OR (US); Jr-Shian Tsai, Portland, OR (US); Gilbert Neiger, Hillsboro, OR (US); Rajesh M. Sankaran, Portland, OR (US); Mesut A. Ergin, Portland, OR (US); Ravi L. Sahita, Beaverton, OR (US); Andrew J. Herdrich, Hillsboro, OR (US); Wei Wang, Nanjing (CN)

(73) Assignee: INTEL PRODUCTS IP LLC, Santa Clara, CA (US)

( * ) Notice: Subject to any disclaimer, the term of this patent is extended or adjusted under 35 U.S.C. 154(b) by 0 days.

(21) Appl. No.: 18/658,822

(22) Filed: May 8, 2024

(65) Prior Publication Data

US 2024/0289160 A1 Aug. 29, 2024

Related U.S. Application Data

(63) Continuation of application No. 17/898,397, filed on Aug. 29, 2022, now Pat. No. 12,333,325, which is a (Continued)

(51) Int. Cl.

*G06F 9/455* (2018.01)
*G06F 9/30* (2018.01)

(Continued)

(52) U.S. Cl.

CPC ........ *G06F 9/45558* (2013.01); *G06F 9/3004* (2013.01); *G06F 9/45533* (2013.01);

(Continued)

(58) Field of Classification Search

None

See application file for complete search history.

(56) References Cited

U.S. PATENT DOCUMENTS

| | | | |
|---|---|---|---|
| 5,987,557 | A | 11/1999 | Ebrahim |
| 6,192,455 | B1 | 2/2001 | Bogin et al. |

(Continued)

FOREIGN PATENT DOCUMENTS

| | | | |
|---|---|---|---|
| CN | 101542441 | A | 9/2009 |
| CN | 104204990 | A | 12/2014 |

(Continued)

OTHER PUBLICATIONS

Allowance Decision of Examination, TW App. No. 106117239, Oct. 13, 2021, 3 pages (1 pages of English Translation and 2 pages of Original Document).

(Continued)

*Primary Examiner* — Jared I Rutz
*Assistant Examiner* — Alexander J Yoon
(74) *Attorney, Agent, or Firm* — Nicholson De Vos Webster & Elliott LLP

(57) ABSTRACT

A processor of an aspect includes a decode unit to decode an aperture access instruction, and an execution unit coupled with the decode unit. The execution unit, in response to the aperture access instruction, is to read a host physical memory address, which is to be associated with an aperture that is to be in system memory, from an access protected structure, and access data within the aperture at a host physical memory address that is not to be obtained through address translation. Other processors are also disclosed, as are methods, systems, and machine-readable medium storing aperture access instructions.

18 Claims, 17 Drawing Sheets

Related U.S. Application Data continuation of application No. 15/200,725, filed on Jul. 1, 2016, now Pat. No. 11,442,760.

(51) Int. Cl.

| | |
|---|---|
| ***G06F 12/02*** | (2006.01) |
| ***G06F 12/10*** | (2016.01) |
| ***G06F 12/109*** | (2016.01) |
| ***G11C 7/10*** | (2006.01) |

(52) U.S. Cl.

CPC .......... *G06F 12/0292* (2013.01); *G06F 12/10* (2013.01); *G06F 12/109* (2013.01); *G11C 7/1072* (2013.01); *G06F 2009/45583* (2013.01); *G06F 2009/45591* (2013.01); *G06F 2009/45595* (2013.01); *G06F 2212/151* (2013.01)

(56) References Cited

U.S. PATENT DOCUMENTS

| | | | | |
|---|---|---|---|---|
| 7,461,210 | B1 | 12/2008 | Wentzlaff et al. | |
| 7,506,096 | B1 | 3/2009 | Koryakin et al. | |
| 8,239,657 | B2 | 8/2012 | Kopec et al. | |
| 8,347,064 | B1 | 1/2013 | Glasco et al. | |
| 2004/0177261 | A1 | 9/2004 | Watt et al. | |
| 2005/0071840 | A1 | 3/2005 | Neiger et al. | |
| 2005/0114855 | A1 | 5/2005 | Baumberger | |
| 2005/0223225 | A1* | 10/2005 | Campbell | G06F 21/6281 713/166 |
| 2007/0050764 | A1 | 3/2007 | Traut | |
| 2008/0140971 | A1 | 6/2008 | Dankel et al. | |
| 2010/0106954 | A1 | 4/2010 | Muchsel et al. | |
| 2011/0010483 | A1* | 1/2011 | Liljeberg | G06F 12/1441 718/1 |
| 2011/0320756 | A1 | 12/2011 | Craddock et al. | |
| 2012/0047313 | A1 | 2/2012 | Sinha et al. | |
| 2013/0103923 | A1 | 4/2013 | Pan | |
| 2013/0111195 | A1 | 5/2013 | Wilson | |
| 2013/0117743 | A1 | 5/2013 | Neiger et al. | |
| 2014/0189683 | A1 | 7/2014 | Bing et al. | |
| 2015/0121366 | A1* | 4/2015 | Neiger | G06F 9/4555 718/1 |
| 2015/0278112 | A1 | 10/2015 | Gschwind | |
| 2015/0347052 | A1 | 12/2015 | Grisenthwaite et al. | |
| 2016/0048464 | A1 | 2/2016 | Nakajima et al. | |
| 2016/0057509 | A1 | 2/2016 | Yamagishi et al. | |
| 2016/0085687 | A1 | 3/2016 | Baruch et al. | |
| 2016/0188354 | A1* | 6/2016 | Goldsmith | G06F 12/1009 718/1 |
| 2016/0239430 | A1 | 8/2016 | Tsirkin et al. | |
| 2016/0371496 | A1* | 12/2016 | Sell | G06F 21/52 |

FOREIGN PATENT DOCUMENTS

| | | | |
|---|---|---|---|
| CN | 104956342 | A | 9/2015 |
| CN | 105122828 | A | 12/2015 |
| KR | 10-2016-0024995 | A | 3/2016 |
| TW | 201510722 | A | 3/2015 |
| TW | 201525690 | A | 7/2015 |
| WO | 2013/095577 | A1 | 6/2013 |

OTHER PUBLICATIONS

Final Office Action, U.S. Appl. No. 15/200,725, Jul. 26, 2021, 26 pages.

Final Office Action, U.S. Appl. No. 17/898,397, Jan. 12, 2024, 22 pages.

Final Office Action, U.S. Appl. No. 15/200,725, Mar. 11, 2020, 24 pages.

Intel, "Intel 64 and IA-32 Architectures Software Developer's Manual" Order No. 325462-058US, Apr. 2016, pp. 3006-3431.

International Preliminary Report on Patentability for Application No. PCT/US2017/035398, Jan. 10, 2019, 13 pages.

International Search Report and Written Opinion for Application No. PCT/US2017/035398, Sep. 4, 2017 , 14 pages.

Jianqing, X., et al., "Design of Memory Management Unit in Sparc V8 Processor", Science Technology and Engineering, No. 1, Nov. 8, 2010.

Long, X. M., et al., "Dynamic switching characteristic dependence on sidewall angle for phase change memory", Solid-State Electronics, vol. 67. No. 1, Jan. 2012, pp. 1-5.

Non Final Office Action, U.S. Appl. No. 15/200,725, Oct. 30, 2020, 25 pages.

Non-Final Office Action, U.S. Appl. No. 17/898,397, Mar. 13, 2023, 20 pages.

Notice of Allowance, CN App. No. 201780041339.8, Feb. 5, 2024, 05 pages (3 pages of English Translation and 2 pages of Original Document).

Notice of Allowance, U.S. Appl. No. 15/200,725, Apr. 29, 2022, 14 pages.

Office Action, CN App. No. 201780041339.8, Oct. 30, 2023, 1 page of Original Document Only.

Office Action, CN App. No. 201780041339.8, Oct. 28, 2022, 14 pages of Original Document Only.

Office Action, TW App. No. 106117239, May 24, 2021, 32 pages (17 pages of English Translation and 15 pages of Original Document).

Second Office Action, Chinese App. No. 201780041339.8, Nov. 9, 2023, 14 pages (8 pages of English Translation and 6 pages of Original Document).

Zabaljauregui, Matias. Hardware Assisted Virtualization Intel Virtualization Technology, Jun. 2008, 54 pages.

Notice of Allowance, U.S. Appl. No. 17/898,397, Feb. 19, 2025, 13 pages.

* cited by examiner

FIG. 11A
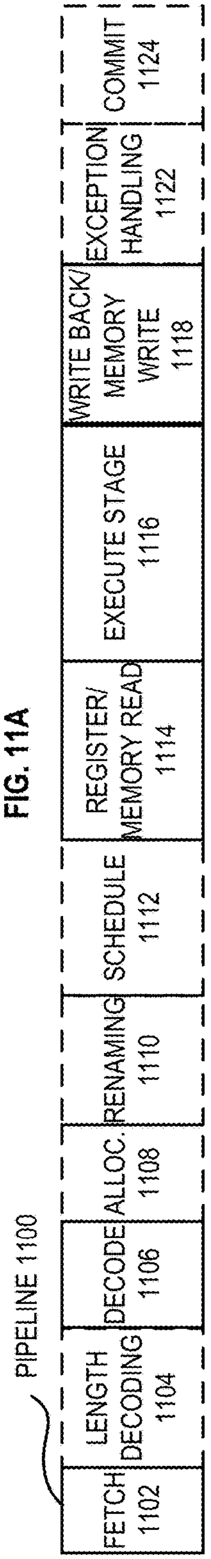
CORE 1190
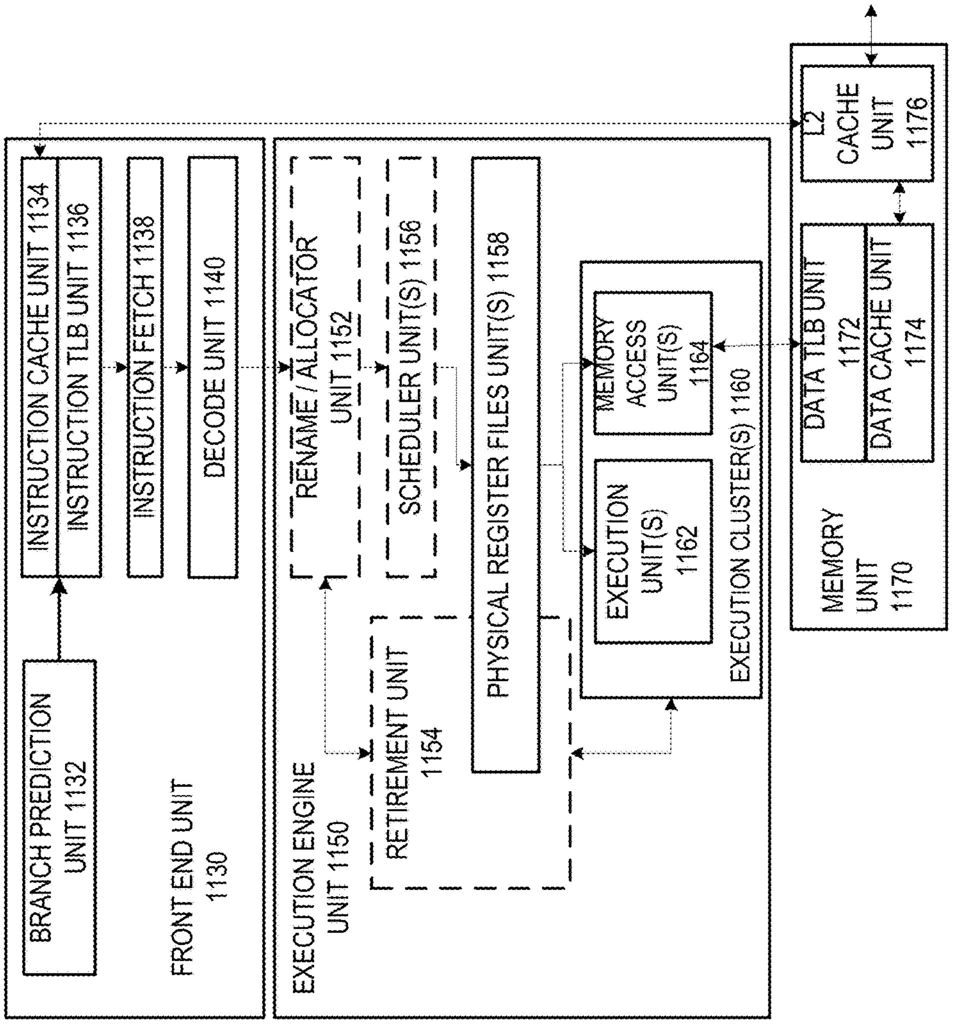
FIG. 11B

APERTURE ACCESS PROCESSORS, METHODS, SYSTEMS, AND INSTRUCTIONS

RELATED APPLICATIONS

This application is a continuation of co-pending U.S. patent application Ser. No. 17/898,397, filed Aug. 29, 2022, which is a continuation of U.S. patent application Ser. No. 15/200,725, filed Jul. 1, 2016, titled "APERTURE ACCESS PROCESSORS, METHODS, SYSTEMS, AND INSTRUCTIONS", currently pending. U.S. patent application Ser. No. 15/200,725, now U.S. Pat. No. 11,442,760, Issued on Sep. 13, 2022, is hereby incorporated herein by reference.

BACKGROUND

Technical Field

Embodiments described herein generally relate to processors. In particular, embodiments described herein generally relate to processors that have an architectural extension to support virtualization.

Background Information

A virtual machine monitor (VMM) may be used to create a virtual machine system in which virtual machines (VMs) may operate. The VMM may present the abstraction of the VMs to guest software running within each of the VMs. The VMM may facilitate access to system hardware, while generally retaining control over the system hardware and various aspects of operation.

In some implementations, the VMs may be generally unaware that they are running on the VMM, and may be generally unaware that there are other VMs in the system. In other implementations, the VMs may be aware that they are running on the VMM, and may be aware that there are other VMs in the system. Such VMs are sometimes described as being "para-virtualized" or "enlightened."

BRIEF DESCRIPTION OF THE DRAWINGS

The invention may best be understood by referring to the following description and accompanying drawings that are used to illustrate embodiments. In the drawings:

FIG. 11A is a block diagram illustrating an embodiment of an in-order pipeline and an embodiment of a register renaming out-of-order issue/execution pipeline.

FIG. 11B is a block diagram of an embodiment of processor core including a front end unit coupled to an execution engine unit and both coupled to a memory unit.

DETAILED DESCRIPTION OF EMBODIMENTS

Disclosed herein are embodiments of aperture access instructions, embodiments of processors to perform the aperture access instructions, embodiments of methods performed by the processors when performing the aperture access instructions, embodiments of systems incorporating one or more processors to perform the aperture access instructions, and embodiments of programs or machine-readable mediums providing the aperture access instructions. In some embodiments, the processors may have a decode unit to decode an aperture access instruction, or other logic to receive the aperture access instruction, and an execution unit or other logic to perform the aperture access instruction. Also disclosed are modules, programs, and machine-readable mediums to manage apertures (e.g., one or more of allocate apertures, protect apertures, configure which entities are able to access apertures, etc.).

In the following description, numerous specific details are set forth (e.g., specific instruction operations, data formats, processor configurations, microarchitectural details, sequences of operations, virtual machine systems, etc.). However, embodiments may be practiced without these specific details. In other instances, well-known circuits, structures and techniques have not been shown in detail to avoid obscuring the understanding of the description.

Figure 1:
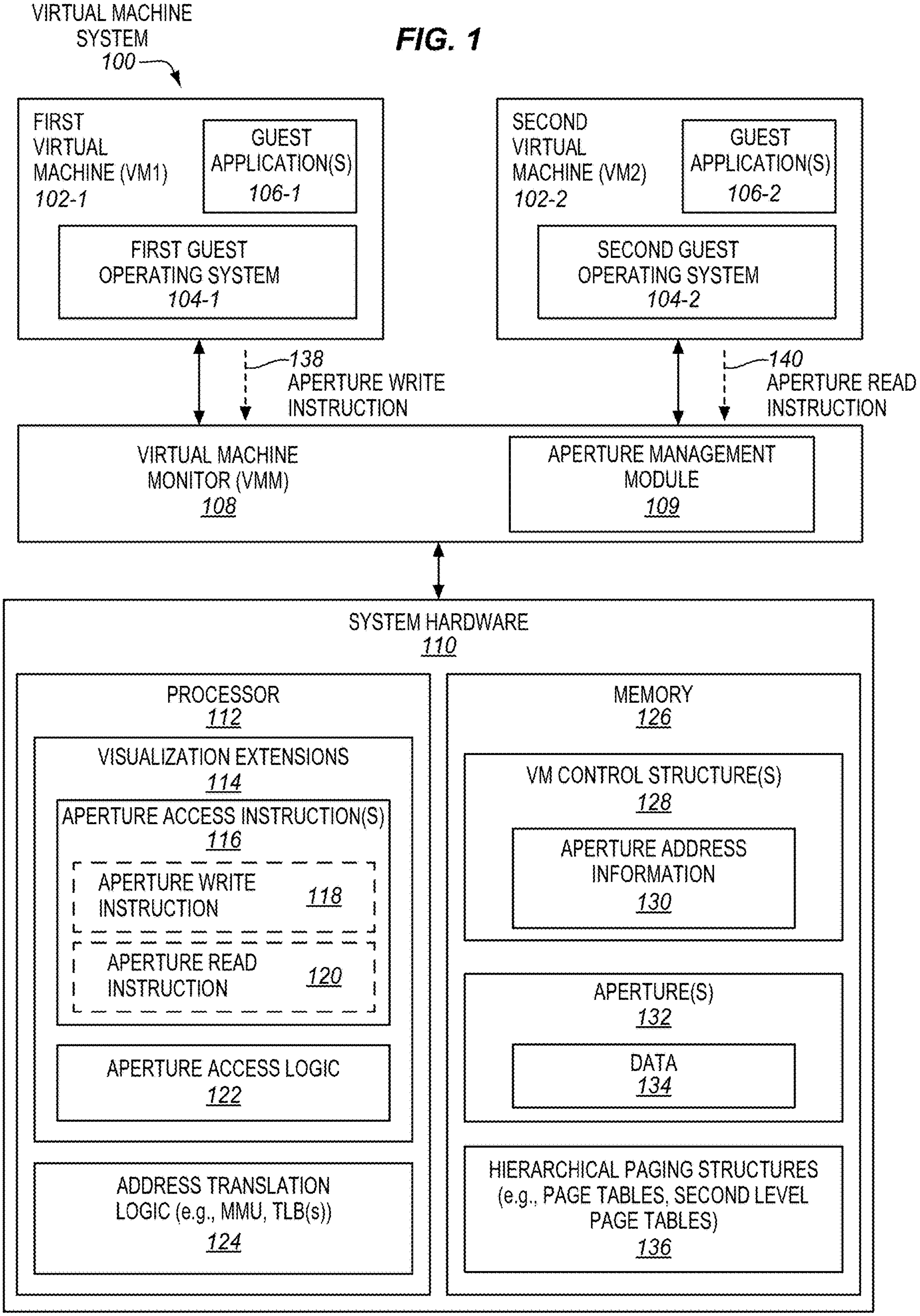
FIG. 1 is a block diagram of an embodiment of a virtual machine system in which embodiments of the invention may be implemented.

FIG. 1 is a block diagram of an embodiment of a virtual machine system 100 in which embodiments of the invention may be implemented. The virtual machine system includes a plurality of virtual machines (VMs) 102, a virtual machine monitor (VMM) 108, and system hardware 110. In the illustrated example, the VMs include a first virtual machine (VM1) 102-1, a second virtual machine (VM2) 102-2, and optionally others.

In various embodiments, the system hardware 110 may represent one or more desktop computers, laptop computers, notebook computers, tablet computers, servers, mainframe, network devices (e.g., a router, switch, etc.), smart phones, or one or more other types of computer systems or electronic devices. In some embodiments, the virtual machine system may optionally be implemented on two or more such electronic devices and/or may be a distributed virtual machine system, although the scope of the invention is not so limited. Typically, the system hardware may include at least one processor 112 and a memory 126. In some embodiments, the processor may be a general-purpose processor. Alternatively, the processor may be special-purpose processor. Examples of suitable special-purpose processors include, but are not limited to, network processors, communications processors, cryptographic processors, graphics processors, co-processors, embedded processors, and digital signal processors (DSPs), to name just a few examples. Two or more processors, of either the same or different type, may also optionally be used. The memory 126 may include one or more memory devices of one or more types. Examples of suitable memory devices include, but are not limited to, various different types of random access memory (RAM), various different types of read only memory (ROM), one or more hard disks, flash memory, and the like, and various combinations thereof. The memory may be used to store software and data used to implement the virtual machine system.

Each of the VMs may have its own guest software. As shown, the first VM may have a first guest operating system 104-1, and a first set of one or more guest applications 106-1. Likewise, the second VM may have a second guest operating system 104-2, and a second set of one or more guest applications 106-2. In various embodiments, these operating systems may represent standard or real-time operating systems, highly stripped down operating apparatus with limited operating system functionality, or software that does not necessarily include all or at least some traditional operating system functionalities and/or facilities. The guest software on each virtual machine may often expect to access at least some of the system hardware (e.g., the processor 112 and the memory 126).

The virtual machine system also includes the virtual machine monitor (VMM) 108. In the illustrated embodiment, a single VMM is shown, although two or more VMMs may optionally be used in other embodiments. The VMM is also sometimes referred to in the arts as a hypervisor. The VMM may be implemented in software, firmware, hardware, or a combination thereof. The VMM may be more privileged than the VMs. The VMM may emulate and export a bare machine interface to higher level software. The VMM may present the abstraction of the plurality of VMs 102, to other software (e.g., the guest software running on and/or within the VMs). The VMM may facilitate access by the guest software to the system hardware 110, while retaining sufficient control over the system hardware and/or over certain other operational aspects (e.g., interrupts, etc.) to help provide proper operation of the guest software, and to help provide protection from and between the guest software.

The VMM may generally allocate resources of the system hardware to the VMs (e.g., hardware threads, system memory space, disk drive storage space, etc.) The VMM may also take over control when needed, or when certain types of events occur. Transitions from VM operation to VMM operation and/or the transfer of control from guest software to the VMM may be referred to as a VM exit. Potential causes of VM exits include, but are not limited to, certain types of privileged exceptions, system events, virtualization events, access violations to protected regions of memory, and the like. Transitions into VM operation and/or the transfer of control from the VMM to the VM (e.g., to guest software) may be referred to as a VM entry. Such VM entries and exits generally tend to have an associated overhead or performance cost due in large part to context or state switching. The VMs need not necessarily be unaware that they are running on a VMM, and need not necessarily be unaware that there are other VMs in the system, but rather may be "para-virtualized" or "enlightened." Often however, except for certain fairly limited types of interactions, such as sharing of data between VMs as described elsewhere herein, the VMM may isolate in certain ways, the guest software stacks of the different VMs from one another.

The virtual machine system 100 may use virtual memory. Virtual memory generally represents a memory management technique in which potentially non-contiguous physical memory (e.g., a physical address space) is presented to processes and/or applications (e.g., guest software) as a contiguous memory (e.g., a virtual address space). The virtual address space may also sometimes be referred to as a linear address space. The actual allocated physical memory may not be contiguous or sequentially organized, and may even be included on multiple different types of storage devices. However, due to the virtual memory, the processes may view the memory as a linear sequence through the contiguous virtual address space. Virtual memory allows applications to execute without requiring their entire address space to be resident in physical memory, which may allow the applications to be executed using less physical memory than would be needed to accommodate their entire address space. The applications may not need to be aware of how the physical memory is allocated. Virtual memory may also be used to isolate applications from each other, since each applications virtual address space may be independently mapped to one or more pages of physical memory allocated exclusively to that application. The physical memory may be logically divided into pages. The pages of the physical memory may be mapped to virtual addresses. Processes and applications (e.g., guest software) may view only their virtual address space, while the physical address space is where the corresponding data actually resides in memory.

A process known as address translation may be used to map the virtual address space to the physical address space. The address translation may involve looking up a physical address based on a given virtual address and optionally on other information (e.g., in processor registers). Commonly, the first and second guest operating systems 104-1, 104-2 and the VMM 108 may work together to translate virtual addresses to physical memory addresses of actual physical memory locations in the memory 126. Memory access instructions (e.g., read from memory instructions, write to memory instructions, etc.) may have associated virtual or linear addresses. A set of hierarchical paging structures 136 may be stored in the memory. In the case of the virtual machine system, these hierarchical paging structures may include both a first level of paging structures as well as a second level of paging structures. By way of example, the first level of paging structures may include page tables, or other paging structures, like those commonly used for address translation in non-virtualized systems. Generally, the guest operating systems 104-1, 104-2 may manage, or at least assist with managing, these first level paging structures.

The first level paging structures may be used to translate the virtual addresses of the instructions into so-called guest physical addresses.

The guest physical addresses may not yet represent actual physical memory addresses that can be used to access actual physical memory locations in the memory, but rather may represent intermediate memory addresses needing further address translation. In some embodiments, in addition to the first level of paging structures (e.g., first level page tables), there may also be an additional second level of paging structures, such as, for example, extended page tables, other second level page tables, or other second level paging structures. The VMM may manage the second level paging structures. The guest physical addresses obtained from the first level of paging structures may serve as inputs into the second level of paging structures. The second level of paging structures may be used to translate the guest physical addresses into host physical memory addresses. The host physical memory addresses are also sometimes referred to in the arts as platform physical memory addresses. The host physical memory addresses may represent actual physical memory addresses that may be used to access actual physical memory locations. The second level of paging structures may also have access rights or permissions for the associated pages. By way of example, such access rights or permissions may indicate whether the pages are readable, writeable, executable, or a combination thereof. In such a virtual machine system, accesses to the actual physical memory locations, at least for ordinary load, stores, and other ordinary memory access instructions without special or additional privileges, may generally only be available through valid address translations provided by the second level paging structures and/or as allowed by the VMM.

Referring again to FIG. 1, the hierarchical paging structures 136 are generally stored in the memory. The processor may have address translation logic 124 to help translate virtual memory addresses to host physical memory addresses. By way of example, this address translation logic may include a memory management unit (MMU), and one or more levels of translation lookaside buffers (TLBs). Initially, the MMU may be operative to check the one or more TLBs to see if an address translation is already cached or otherwise stored in the one or more TLBs. Each of the one or more TLBs may cache previously determined virtual memory address to host physical memory address translations. A TLB "hit" occurs when the appropriate address translation is stored in the one or more TLBs. In the event of a TLB hit the address translation may be retrieved from the TLB entry. Conversely, a TLB "miss" occurs when the appropriate address translation is not stored in the one or more TLBs. In the event of a TLB miss, the MMU may perform a page table walk to determine the address translation. For example, the MMU may include a page miss handler unit or logic, a page table walk unit or logic, or the like. For example, the MMU may access and walk or advance through the hierarchical paging structures 136 to try to reach a page table entry that stores the host physical memory address. Once determined, the host physical memory address may be used to access the physical memory. Also, the address translation determined through the page table walk or may be cached in the TLBs, for possible future use. If the address translation is needed again, within a short enough period of time, it may be retrieved relatively quickly from the TLB, without the MMU needing to perform the relatively slower page table walk.

Referring again to FIG. 1, the memory may store at least one virtual machine control structure (VMCS) 128. The at least one VMCS broadly represents at least one access protected structure which is used to store virtual machine and/or virtualization associated controls. The VMCS may be access protected in that generally it is only accessible by a limited set of instructions with special privileges that are specifically designed and intended to interact with it (e.g., special access privilege instructions to configure the VMCS, read the VMCS, write the VMCS, or the like), but not by regular general-purpose read from memory instructions, store to memory instructions, or the like. The VMCS may control various different aspects associated with the operation of the virtual machine system in different embodiments, such as, for example, aspects related to VM operation, VM entries, VM exits, and the like. In some embodiments, a same VMCS may optionally be shared by multiple VMs. In other embodiments, a different set of one or more VMCS may be used for each VM. In yet another aspect, a different set of one or more VMCS may be used for each logical processor of each VM of which there may be at least two. One specific example of a suitable VMCS 128 is the virtual-machine control structures used in the virtual-machine extensions (VMX) of certain Intel® 64 and IA-32 Architecture processors, although the scope of the invention is not so limited. Another specific suitable example of a suitable VMCS 128 is the one used in IBM PowerVM® virtualization technologies on Power System servers, although the scope of the invention is not so limited. For clarity, the use of the term virtual machine control structure and VMCS are not intended to refer to the specific VMCS of VMX, unless specifically specified.

Referring again to FIG. 1, the processor 112 has virtualization extensions 114. The virtualization extensions may include architectural extensions to support virtualization and/or hardware-assisted virtualization support logic. These virtualization extensions may include a set of instructions to support virtualization, and hardware, firmware, software, or a combination of such logic to perform these instructions. In some embodiments, the virtualization extensions may include at least one embodiment of an aperture access instruction 116 as disclosed herein. In some embodiments, the at least one aperture access instruction may optionally include at least one embodiment of an aperture write instruction 118 as disclosed herein, which may be used to write data 134 to an aperture 132. In some embodiments, the at least one aperture access instruction may optionally include at least one embodiment of an aperture read instruction 120 as disclosed herein, which may be used to read the data 134 from the aperture 132. In some embodiments, only one of these instructions may optionally be supported. In other embodiments, both of these instructions may optionally be supported. The virtualization extensions may also include aperture access logic 122 that is operative to perform each of the at least one aperture access instruction 116. In some embodiments, the aperture access instruction(s) may be permitted to use the aperture access logic and access the aperture, but regular general-purpose memory access instructions may not.

In some embodiments, the at least one aperture 132 may be located in the memory 126. The aperture may broadly represent an access protected range, region, or other portion of the memory that may be used to securely store data. In some embodiments, the aperture may represent such a portion of the memory to which access is allowed or restricted by the VMM. In some embodiments, the VMM may include an aperture management module 109 that is operative to perform one or more aspects associated with managing the aperture. Examples of such management aspects include, but are not limited to, allocating a portion of memory for the aperture, configuring the aperture, configuring or allowing one or more VMs to access the aperture, protecting the aperture from access by regular general-purpose memory access instructions, and the like.

In some embodiments, the VMM 108 and/or the aperture management module 109 may control or protect the aperture 132 from unintended access by making the aperture not be accessible or reachable through address translation. For example, in some embodiments, the VMM and/or the aperture management module may configure the second level of the hierarchical paging structures 136 so that there are no translations therein to host physical memory addresses within the aperture. In some embodiments, the VMM and/or the aperture management module may store aperture address information 130 in the virtual machine control structure(s) 128, or in another access protected structure(s). The VMM and/or the aperture management module may selectively only allow access to the aperture address information to one or more intended or authorized entities (e.g., one or more VMs), while keeping the aperture address information secret or confidential and unavailable to non-intended or unauthorized entities (e.g., one or more other VMs). As a result, only the entities that the VMM intends and authorizes to utilize the aperture may be operative to utilize it. This may help to protect or secure data stored in the aperture.

The at least one aperture 132, and the at least one aperture access instruction 116, may be used for various different purposes in different embodiments. As one example, the VMM 108 and/or the aperture management module 109 may make the aperture address information 130 available to both the first VM 102-1 and the second VM 102-2 in order to allow the first and second VMs to share data. By way of example, in some embodiments, the first VM may issue an instance of the aperture write instruction 138 to access the aperture address information 130 (e.g., from the virtual machine control structure 128 or another type of access protected structure), and use it to write or otherwise store the data 134 to the aperture 132 from a source operand of the aperture write instruction. Subsequently, in some embodiments, the second VM2 may issue an instance of the aperture read instruction 140 to access the aperture address information 130 (e.g., from the virtual machine control structure 128 or another type of access protected structure), and use it to read the data 134 from the aperture 132 into a destination operand of the aperture read instruction. In this way the aperture may be used for protected sharing of data between two or more VMs that the VMM allows to access the aperture (e.g., by making the aperture address information 130 accessible).

Figure 2:
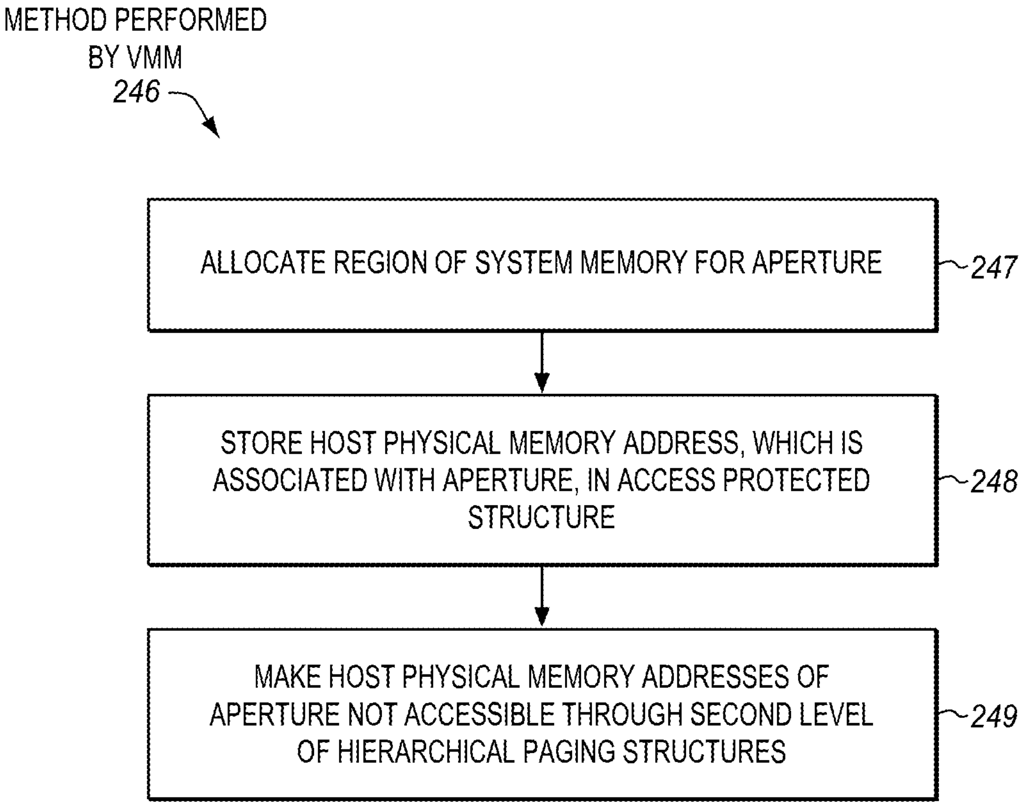
FIG. 2 is a block flow diagram of an embodiment of a method that may be performed by a VMM to provision an aperture.

FIG. 2 is a block flow diagram of an embodiment of a method 246 that may be performed by a VMM to provision an aperture. In some embodiments, the method 246 may be performed by and/or with the VMM 108 and/or the aperture management module 109 of FIG. 1. The components, features, and specific optional details described herein for the VMM 108 and/or the aperture management module 109, also optionally apply to the method 246. Alternatively, the method 246 may be performed by and/or within a similar or different VMM or aperture management module. Moreover, the VMM 108 and/or the aperture management module 109 may perform methods the same as, similar to, or different than the method 246.

The method includes allocating a range, region, or other portion of system memory for an aperture, at block 247. By way of example, in some embodiments, the portion may include one or more pages of the system memory.

A host physical memory address, which is associated with the aperture, may be stored in an access protected structure, at block 248. In some embodiments, the host physical memory address may be the host physical memory address of the aperture. In other embodiments, the host physical memory address may not necessarily be the host physical memory address of the aperture, but may be needed to access the aperture. For example, the host physical memory address may lead to a protected storage location where the host physical memory address of the aperture is stored.

The access protected structure may broadly represent a structure to which access is controlled, restricted, or otherwise protected. In some embodiments, the VMM may protect the access protected structure from unauthorized access. Examples of suitable structures include, but are not limited to, a data structure in memory, a storage location on a processor die, another structure on a die, etc. One specific suitable example of an access protected structure is a virtual machine control structure, although the scope of the invention is not so limited. Alternatively, instead of using a virtual machine control structure, a dedicated structure may be used to store the host physical memory address, without necessarily needing to store some or all of the other type of data often stored in a virtual machine control structure. In some embodiments, such a dedicated structure may optionally be protected using techniques the same as or similar to those used to protect a virtual machine control structure.

In some embodiments, the host physical memory address stored in the access protected structure may be protected from access by instructions that are not specifically designed to access it and/or that do not have special access privileges to access it, but may be accessible to at least one instruction (e.g., the at least one aperture access instruction 116) that is specifically designed to access it and/or that has special access privileges to access it. By way of example, on-die processor logic may be configured to allow or deny access based on the instruction (e.g., its opcode). For example, in some embodiments, the host physical memory address may be stored in the access protected structure which may be in system memory, and on-die processor logic may be operative to selectively allow access to the host physical memory address stored therein by the at least one aperture access instructions 116, and may be operative to prevent access to the host physical memory address stored therein by regular general-purpose memory access instructions (e.g., load/read from memory instructions, store/write to memory instructions, etc.).

Referring again to FIG. 2, host physical memory addresses of the aperture (e.g., all host physical memory addresses for the entire aperture) may be made inaccessible through extended page tables, other second level page tables, or other second level hierarchical paging structures, at block 249. For example, the second level hierarchical paging structures may be configured not to have any translations to the host physical memory addresses of the aperture (e.g., all host physical memory addresses for the entire aperture). This may help to make the aperture generally inaccessible or unreachable through address translation. This in turn may help to protect the aperture from access by regular general-purpose memory access instructions (e.g., read from memory instructions, store to memory instructions, memory copy instructions, gather instructions, etc.) that do not have special access privileges and can generally only reach actual physical memory through paging and address translation. For example, such memory access instructions may specify virtual or linear addresses that need to be converted to host physical memory addresses through address translation in order to access the actual physical memory. In a virtual machine system, such address translation eventually need to pass through the second level hierarchical paging structures (or TLBs caching translations obtained based on such second level hierarchical paging structures). However, configuring the second level hierarchical paging structures not to have any translations to host physical memory addresses falling anywhere within the entire aperture, when such instructions go through address translation they will not find any host physical memory addresses or paths that allow them to access the aperture.

The VMM may use the method 246 in different ways in different embodiments. As one example, the VMM may use the method to selectively allow two or more VMs to use the aperture to share data. By way of example, this may be done in response to a request, such as, for example, through a hypercall, from a VM or associated software requesting that the VM be allowed to share data with one or more other VMs through the aperture. The VMM may decide to allow such data sharing, and may provision the aperture (if one is not already available), and may selectively configure the intended VMs to use the aperture, without configuring other unintended VMs to use the aperture. This may be achieved by selectively allowing only the intended VMs, but not the other unintended VMs, to be able to access the host physical memory address. The host physical memory address may be needed (potentially along with one or more other host physical memory addresses) in order to access the aperture. As one example, each VM may have its own corresponding access protected structure (e.g., a VMCS), and the VMM may selectively store the host physical memory address in only the access protected structures corresponding to those VMs it allows to use the aperture, but not in the access protected structures corresponding to other VMs. As another example, multiple VMs may share an access protected structure (e.g., a shared VMCS), and there may be controls (e.g., in the shared access protected structure) to control which of the VMs are allowed to access the host physical memory address. Other approaches are also possible.

Figure 3:
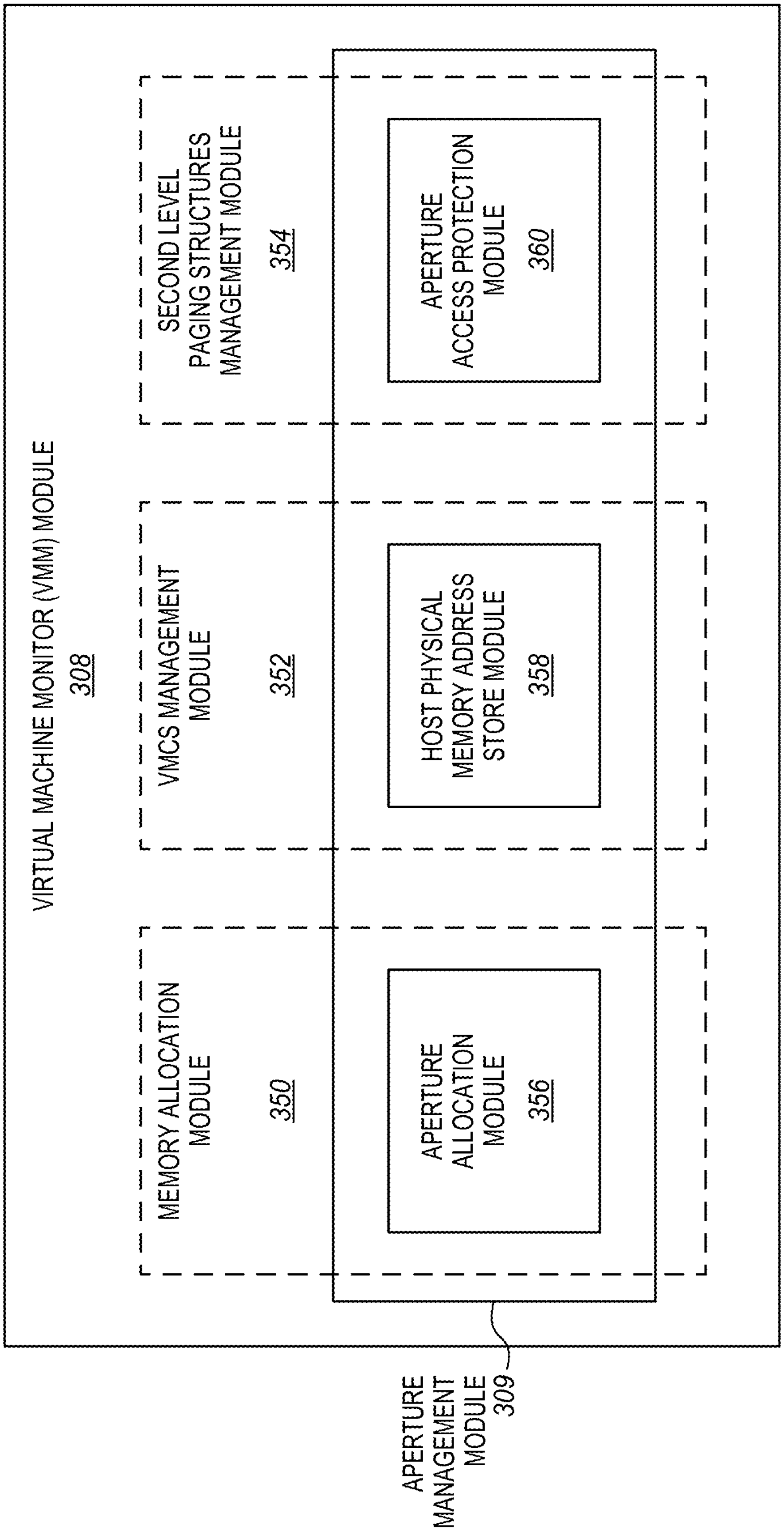
FIG. 3 is a block diagram of an example embodiment of a VMM module.

FIG. 3 is a block diagram of an example embodiment of a VMM module 308. In some embodiments, the VMM module 308 may be operative to perform the method 246 of FIG. 2. The specific optional features and details described for the method 246 may also optionally apply to the VMM module 308. Alternatively, the method 246 may be performed by and/or with a similar or different VMM module. Moreover, the VMM module 308 may be operative to perform methods similar to or different than the method 246.

The VMM module includes a memory allocation module 350, a virtual machine control structure (VMCS) management module 352, and a second level hierarchical paging structures management module 354. Each of these modules may be implemented in hardware, firmware, software, or a combination thereof. The memory allocation module may be operative to allocate pages of physical memory. The VMCS management module may be operative to manage one or more VMCSs. The second level hierarchical paging structures management module may be operative to manage one or more second level hierarchical paging structures.

The VMM module may also include an embodiment of an aperture management module 309, which may be implemented in hardware, firmware, software, or a combination thereof. As shown, in some embodiments, the aperture management module may optionally include functionality or modules implemented within the memory allocation module, the VMCS management module, and the second level hierarchical paging structures management module. Specifically, an aperture allocation module 356 may optionally be implemented within the memory allocation module, a host physical memory address store module 358 may optionally be implemented within the VCMS management module, and an aperture access protection module 360 may optionally be implemented within the second level hierarchical paging structures management module. Alternatively, each of these modules may optionally be implemented as a separate component that may interact with the memory allocation module, the VMCS management module, and the second level hierarchical paging structures management module when needed.

In some embodiments, the aperture allocation module 356 and/or the memory allocation module 350 and/or the aperture management module 309 may be operative to allocate a region of system memory for the aperture. In some embodiments, this may be done similarly as described for block 247 of FIG. 2. In some embodiments, the host physical memory address store module 358 and/or the VMCS management module 352 and/or the aperture management module 309 may be operative to store a host physical memory address, which is to be associated with the aperture, in the one or more virtual machine control structures. In some embodiments, this may be done similarly as described for block 248 of FIG. 2. In some embodiments, the aperture access protection module 360 and/or the second level hierarchical paging structures management module 354 and/or the aperture management module 309 may be operative to make host physical memory addresses of the aperture not accessible through the one or more second level hierarchical paging structures. In some embodiments, this may be done similarly as described for block 249 of FIG. 2.

Figure 4:
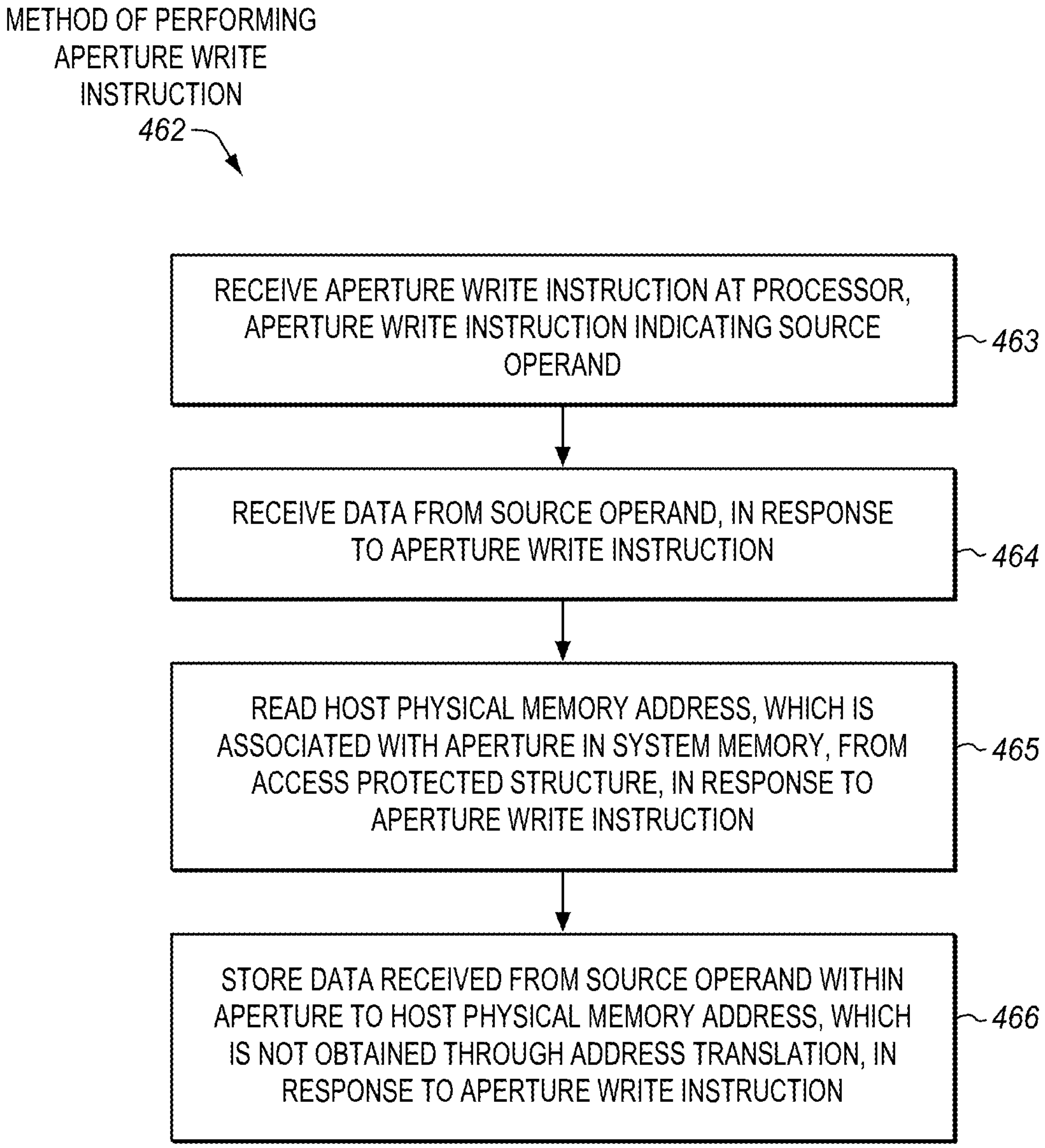
FIG. 4 is a block flow diagram of an embodiment of a method of performing an embodiment of an aperture write instruction.

FIG. 4 is a block flow diagram of an embodiment of a method 682 of performing an embodiment of an aperture write instruction. In various embodiments, the method may be performed by a processor, instruction processing apparatus, digital logic device, or integrated circuit.

The method includes receiving the aperture write instruction, at block 463. In various aspects, the instruction may be received at a processor or a portion thereof (e.g., an instruction fetch unit, a decode unit, a bus interface unit, etc.). In various aspects, the instruction may be received from an off-processor and/or off-die source (e.g., from memory, interconnect, etc.), or from an on-processor and/or on-die source (e.g., from an instruction cache, instruction queue, etc.).

The aperture write instruction may specify (e.g., explicitly specify through a field or other set of bits), or otherwise indicate (e.g., implicitly indicate), a source operand. In some embodiments, the source operand may optionally be in memory. In other embodiments, the source operand may optionally be in a register of the processor. In still other embodiments, other source storage locations may optionally be used.

At block 464, data may be accessed or otherwise received from the source operand, in response to the aperture write instruction. In one specific example embodiment, the amount of data may optionally be sixty-four bytes of data. In other embodiments, the amount of data may optionally be either more or less than sixty-four bytes.

At block 465, a host physical memory address, which is associated with an aperture in system memory, may be read from an access protected structure, in response to the aperture write instruction. The access protected structure may be similar to or the same as those discussed above. In some embodiments, the host physical memory address may not be exposed architecturally to software to which the aperture write instruction corresponds and/or may remain invisible to such software.

Then, at block 466, the data received from the source operand may be stored within the aperture to a host physical memory address, in response to the aperture write instruction. In some embodiments, the host physical memory address to which the data is stored may not have been obtained through address translation (e.g., may not have been obtained from a TLB, or by performing a page table walk, etc.).

In some embodiments, the host physical memory address read from the protected structure at block 465 may optionally be within the same aperture where the data is stored at block 466. For example, the host physical memory address read from the protected structure at block 465 may optionally be a base of the aperture, the instruction may further have an offset from the base of the aperture, and the host physical memory address where the data is stored at block 466 may optionally be the address obtained by applying the offset to the base. In other embodiments, the host physical memory address read from the protected structure at block 465 may optionally not be within the same aperture where the data is stored at block 466. Rather, in some embodiments, the host physical memory address read from the protected structure at block 465 may address a location in memory where one or more other host physical memory addresses are stored. In some embodiments, there may optionally be a list or otherwise multiple such other host physical memory addresses, for example, which each correspond to a different aperture. In such cases, the instruction may optionally have an index or other aperture selector to select one of the host physical memory addresses and/or select one of the apertures. This selected host physical memory address may, in some embodiments, be the host physical memory address used at block 466, or in other embodiments be the base host physical memory address to which an offset indicated by the instruction may be applied to determine the host physical memory address used at block 466. In this case, there is only a single level of indirection, although optionally two or more levels of indirection may also optionally be used. Generally, the host physical memory address read from the access protected structure at block 465 may represent at least one such host physical memory address needed to access the aperture.

The illustrated method involves architectural operations (e.g., those visible from a software perspective). In other embodiments, the method may optionally include one or more microarchitectural operations. By way of example, the instruction may be fetched, decoded, scheduled out-of-order, source operands may be accessed, an execution unit may perform microarchitectural operations to implement the instruction, etc.

Figure 5:
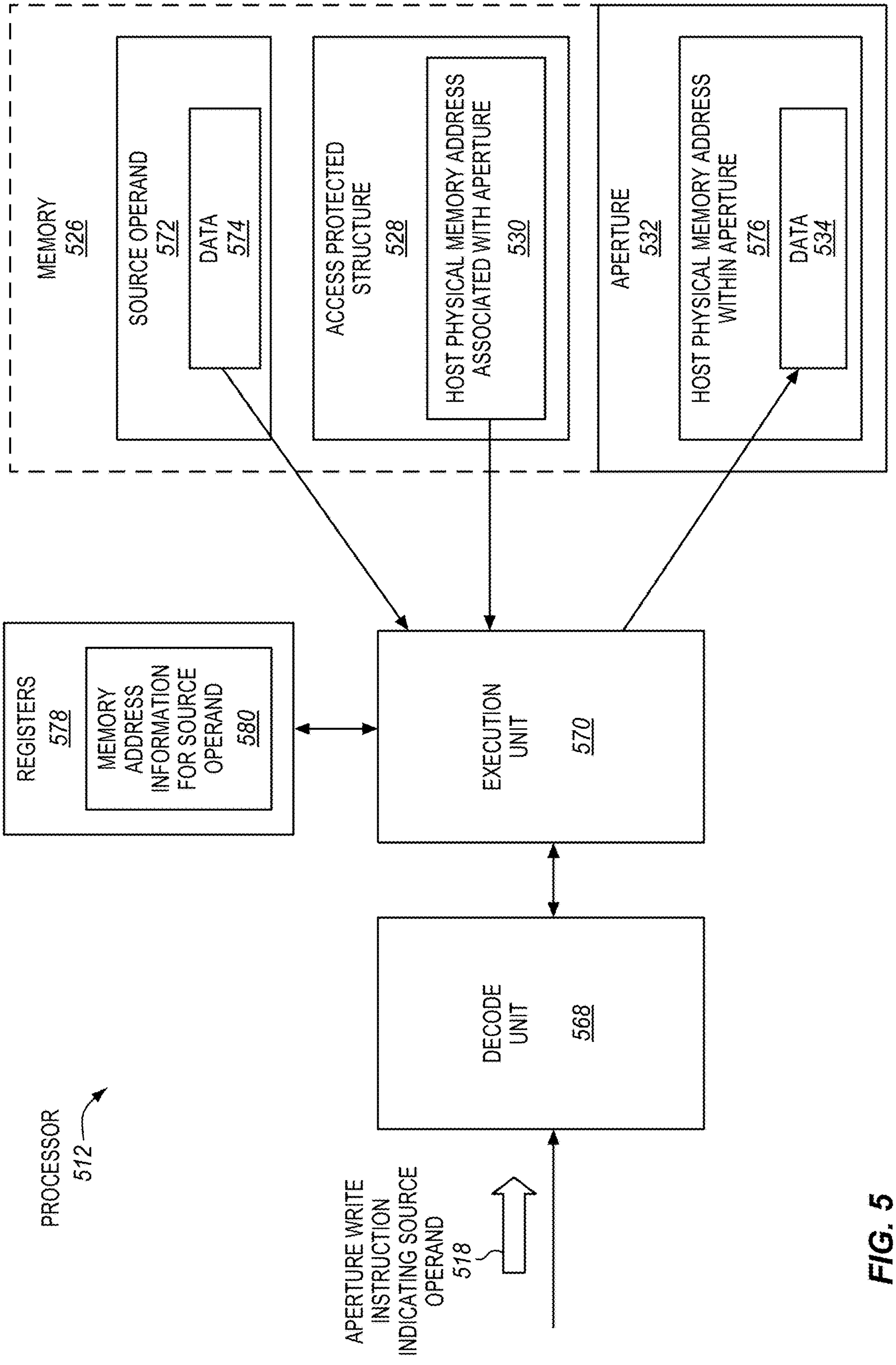
FIG. 5 is a block diagram of an embodiment of a processor that is operative to perform an embodiment of an aperture write instruction.

FIG. 5 is a block diagram of an embodiment of a processor 512 that is operative to perform an embodiment of an aperture write instruction 518. In some embodiments, the processor 512 may be operative to perform the method 462 of FIG. 4. The components, features, and specific optional details described herein for the processor 512 and/or the instruction 518, also optionally apply to the method 462. Alternatively, the method 462 may be performed by and/or within a similar or different processor or apparatus and/or using a similar or different instruction. Moreover, the processor 512 may be operative to perform methods similar to or different than the method 462.

In some embodiments, the processor may be a general-purpose processor (e.g., a general-purpose microprocessor or central processing unit (CPU) of the type used in desktop, laptop, or other computers). Alternatively, the processor may be a special-purpose processor. Examples of suitable special-purpose processors include, but are not limited to, network processors, communications processors, cryptographic processors, graphics processors, co-processors, embedded processors, digital signal processors (DSPs), and controllers (e.g., microcontrollers). The processor may have any of various complex instruction set computing (CISC) architectures, reduced instruction set computing (RISC) architectures, very long instruction word (VLIW) architectures, hybrid architectures, other types of architectures, or have a combination of different architectures (e.g., different cores may have different architectures). In some embodiments, the processor may include be disposed on at least one integrated circuit or semiconductor die. In some embodiments, the processor may include at least some hardware (e.g., transistors, integrated circuitry, non-volatile memory storing microcode, or the like).

During operation, the processor 512 may receive the aperture write instruction 518. For example, the instruction may be received from memory over a bus or other interconnect. The instruction may represent a macroinstruction, machine code instruction, or other instruction or control signal of an instruction set of the processor. In some embodiments, the aperture write instruction may explicitly specify (e.g., through one or more fields or a set of bits), or otherwise indicate (e.g., implicitly indicate), a source operand 572 having data 574. As one example, the instruction may have a source operand specification field to specify a register, memory location, or other storage location for the source operand. Alternatively, the source operand may optionally be stored in a storage location that is implicit to the instruction (e.g., a register that is implicitly or inherently indicated by an opcode of the instruction although not expressed). By way of example, as shown in the illustrated example embodiment, the source operand 572 may be stored in memory 526, and the aperture write instruction may specify or otherwise indicate one or more registers of a set of registers 578 having memory address information 580 to address the source operand 572.

Referring again to FIG. 1, the processor includes a decode unit or decoder 568. The decode unit may receive and decode the aperture write instruction. The decode unit may output one or more relatively lower-level instructions or control signals (e.g., one or more microinstructions, micro-operations, micro-code entry points, decoded instructions or control signals, etc.), which reflect, represent, and/or are derived from the relatively higher-level aperture write instruction. In some embodiments, the decode unit may include one or more input structures (e.g., port(s), interconnect(s), an interface) to receive the aperture write instruction, an instruction recognition and decode logic coupled therewith to recognize and decode the aperture write instruction, and one or more output structures (e.g., port(s), interconnect(s), an interface) coupled therewith to output the lower-level instruction(s) or control signal(s). The decode unit may be implemented using various different mechanisms including, but not limited to, microcode read only memories (ROMs), look-up tables, hardware implementations, programmable logic arrays (PLAs), and other mechanisms suitable to implement decode units. In some embodiments, the decode unit may be included on a die (e.g., on die with the execution unit 570). In some embodiments, the decode unit may include at least some hardware (e.g., transistors, integrated circuitry, or on-die firmware, etc.).

In some embodiments, instead of the aperture write instruction being provided directly to the decode unit 568, an instruction emulator, translator, morpher, interpreter, or other instruction conversion module may optionally be used. Various types of instruction conversion modules may be implemented in software, hardware, firmware, or a combination thereof. In some embodiments, the instruction conversion module may be located outside the processor, such as, for example, on a separate die and/or in a memory (e.g., as a static, dynamic, or runtime emulation module). By way of example, the instruction conversion module may receive the aperture write instruction, which may be of a first instruction set, and may emulate, translate, morph, interpret, or otherwise convert the aperture write instruction into one or more corresponding intermediate instructions or control signals, which may be of a second different instruction set. The one or more intermediate instructions or control signals of the second instruction set may be provided to a decode unit (e.g., decode unit 568), which may decode them into one or more lower-level instructions or control signals executable by native hardware of the processor (e.g., one or more execution units).

Referring again to FIG. 5, the execution unit 570 is coupled with the decode unit 568. In some embodiments, the execution unit may be on a die or integrated circuit (e.g., on die or integrated circuit with the decode unit). The execution unit may receive the one or more decoded or otherwise converted instructions or control signals that represent and/or are derived from the aperture write instruction. During operation, when deployed in a system, the execution unit may be operative to be coupled with the memory 526. The execution unit and/or the processor may include specific or particular logic (e.g., transistors, integrated circuitry, or other hardware potentially combined with firmware (e.g., instructions stored in non-volatile memory) and/or software) that is operative to perform the aperture write instruction. The illustrated execution unit is shown as a single unit, although it is to be appreciated that the execution unit may potentially/optionally include logic that is distributed or dispersed over various different components of the memory subsystem or memory access resources of the processor.

The execution unit may be operative in response to and/or as a result of the aperture write instruction (e.g., in response to one or more instructions or control signals decoded from the instruction and/or in response to the instruction being decoded and/or in response to the instruction being provided to a decoder) to access or otherwise receive the data 574 of the source operand 572. In cases where the source operand is in memory, the execution unit and/or the processor may perform address translation to access the source operand. In one specific example embodiment, the amount of data may optionally be sixty-four bytes of data. In other embodiments, the amount of data may optionally be either more or less than sixty-four bytes.

The execution unit may also be operative in response to and/or as a result of the aperture write instruction to access or otherwise receive a host physical memory address 530 associated with the aperture 532. As shown, in some embodiments, the host physical memory address may optionally be stored in an access protected structure 528. The access protected structure may be similar to or the same as those previously discussed. As discussed above, the access protected structure may broadly represent a structure to which access is controlled, restricted, or otherwise protected. In some embodiments, a VMM may protect the access protected structure from unauthorized access. One specific suitable example of an access protected structure is a VMCS, although the scope of the invention is not so limited. Alternatively, instead of using a virtual machine control structure, a dedicated structure may be used to store the host physical memory address, without necessarily needing to store some or all of the other type of data often stored in a VMCS. In some embodiments, such a dedicated structure may optionally be protected using techniques similar to or the same as those used to protect a VMCS. As shown, in some embodiments, the access protected structure may optionally be stored in the memory 526. Alternatively, an on-die or on-processor access protected structure may optionally be used instead.

In some embodiments, the processor may have on-die logic to protect the host physical memory address 530 stored in the access protected structure 528 from access by instructions that are not specifically designed to access it and/or that do not have special access privileges to access it. For example, regular general-purpose read from memory instructions, store to memory instructions, gather instructions, scatter instructions, and the like, may not be able to access the host physical memory address stored in the access protected structure. However, the on-die logic may allow the aperture write instruction to access the host physical memory address stored in the access protected structure (e.g., based on its opcode). The aperture write instruction may be specially designed and/or specially privileged to access it. In some embodiments, when the access protected structure is stored in the memory, the aperture write instruction may be able to access it even though the aperture write instruction may not indicate any architecturally visible information to indicate where the access protected structure is stored in the memory.

The execution unit may also be operative in response to and/or as a result of the aperture write instruction to store the data 574 received from the source operand 572 within the aperture 532 at a host physical memory address 576. The aperture may be similar to or the same as the apertures previously described. For example, the aperture may broadly represent an access protected range, region, or other portion of the memory that may be used to securely store data. In some embodiments, the aperture may represent such a portion of the memory to which access is allowed or restricted by the VMM. In some embodiments, host physical memory addresses of the aperture (e.g., all host physical memory addresses for the entire aperture) may be inaccessible or unreachable through address translation and/or through second level hierarchical paging structures. For example, in some embodiments, the second level of the hierarchical paging structures may not have any translations therein to host physical memory addresses that land within the aperture.

In some embodiments, the host physical memory address 576 to which the data 534 was stored within the aperture 532 may not have been obtained through address translation (e.g., may not have been obtained from a TLB, or by performing a page table walk, etc.). That is, in some embodiments, the aperture may be accessed without a need to perform address translation from a virtual address to an actual physical memory address (e.g., a host physical memory address), without needing to access first or second level hierarchical paging structures (e.g., extended page tables), and without having to access or attempt to use TLBs that are used to cache translations to host physical addresses. Rather, the host physical memory address 576 may be stored somewhere, retrieved when the aperture write instruction is performed, and used to store data directly into the aperture without further address translation. The aperture write instruction may have special privileges within on-die logic of the processor to bypasses such address translation.

However, regular general-purpose memory access instructions (e.g., read from memory instructions, store to memory instructions, gather instructions, scatter instructions, etc.) may not have such attributes which allow them to bypass address translation. Rather, such regular general-purpose memory access instructions would need to go through address translation and eventually the second level hierarchical paging structures and/or TLBs caching translations already obtained from such second level hierarchical paging structures. However, in some embodiments, as described above, such second level hierarchical paging structures may be configured not to have any translations to host physical memory addresses landing within the aperture. In this way, the aperture may be inaccessible to such regular general-purpose memory access instructions. Moreover, in some embodiments, there may be no need to swap the EPT or other second level page tables. Such swapping of the EPT or other second level page tables (which is not needed), may otherwise have overhead, such as, for example, to serialize the processor, flush the TLBs (e.g., due to their storing stale information not relevant for the new second level page tables), rebuilding the TLBs with updated information, etc.

In some embodiments, the host physical memory address 530 read from the access protected structure 528 may optionally be a base of the aperture 532. In some embodiments, the aperture write instruction may further have an offset which may be applied to this base of the aperture to indicate the host physical memory address 576 where the data 534 is to be stored. In other embodiments, the host physical memory address 530 read from the access protected structure 528 may optionally address a physical memory location where one or more other host physical memory addresses are stored, and one of these other host physical memory addresses may either be the host physical memory address 576 or may be a base of the aperture 532 to which an instruction provided offset may be applied to obtain the host physical memory address 576. For example, the host physical memory address 530 may lead to a list or other set of multiple host physical memory addresses each corresponding to a base of a different aperture. In such cases, the aperture write instruction may further specify or indicate a number, index, or other aperture selector to select one of these apertures. The host physical memory address for the base of the selected aperture may then be read, and an instruction provided offset may be applied to the base to obtain the host physical memory address 576. These are just a few illustrative examples. Other approaches will be apparent to those skilled in the art and having the benefit of the present disclosure. Generally, the host physical memory address 530 read from the access protected structure 528 may represent at least one host physical memory address that is needed to access the aperture 532, and in some cases one or more additional host physical memory addresses may optionally be needed.

In some embodiments, the host physical memory address 530 and the host physical memory address 576 may be kept secret or confidential within the micro-architecture of the processor but never exposed architecturally to software to which the aperture write instruction corresponds. For example, a VM which is performing the aperture write instruction, may not be able to learn or know these host physical memory addresses. The VM may nevertheless be able to utilize the aperture, by performing the access write instruction, even though the VM may not know where the aperture is located in system memory. The VMM may know this host physical memory address, since it may have stored the host physical address in the access protected structure, but the micro-architecture implementing the aperture write instruction may in some cases not even reveal the host physical address to the VMM. Rather, in some embodiments, the micro-architecture may keep the host physical memory address secret from and/or invisible to all software.

To avoid obscuring the description, a relatively simple processor 512 has been shown and described. However, the processor may optionally include other processor components. For example, various different embodiments may include various different combinations and configurations of the components shown and described for any of FIGS. 11-13. All of the components of the processor may be coupled together to allow them to operate as intended. By way of example, considering FIG. 11B, the instruction cache 1134 may cache the instructions, the instruction fetch unit 1138 may fetch the instruction, the decode unit 1140 may decode the instruction, the scheduler unit 1156 may schedule the associated operations, the execution unit 1162 may perform the instruction, the retirement unit 1154 may retire the instruction, etc.

Figure 6:
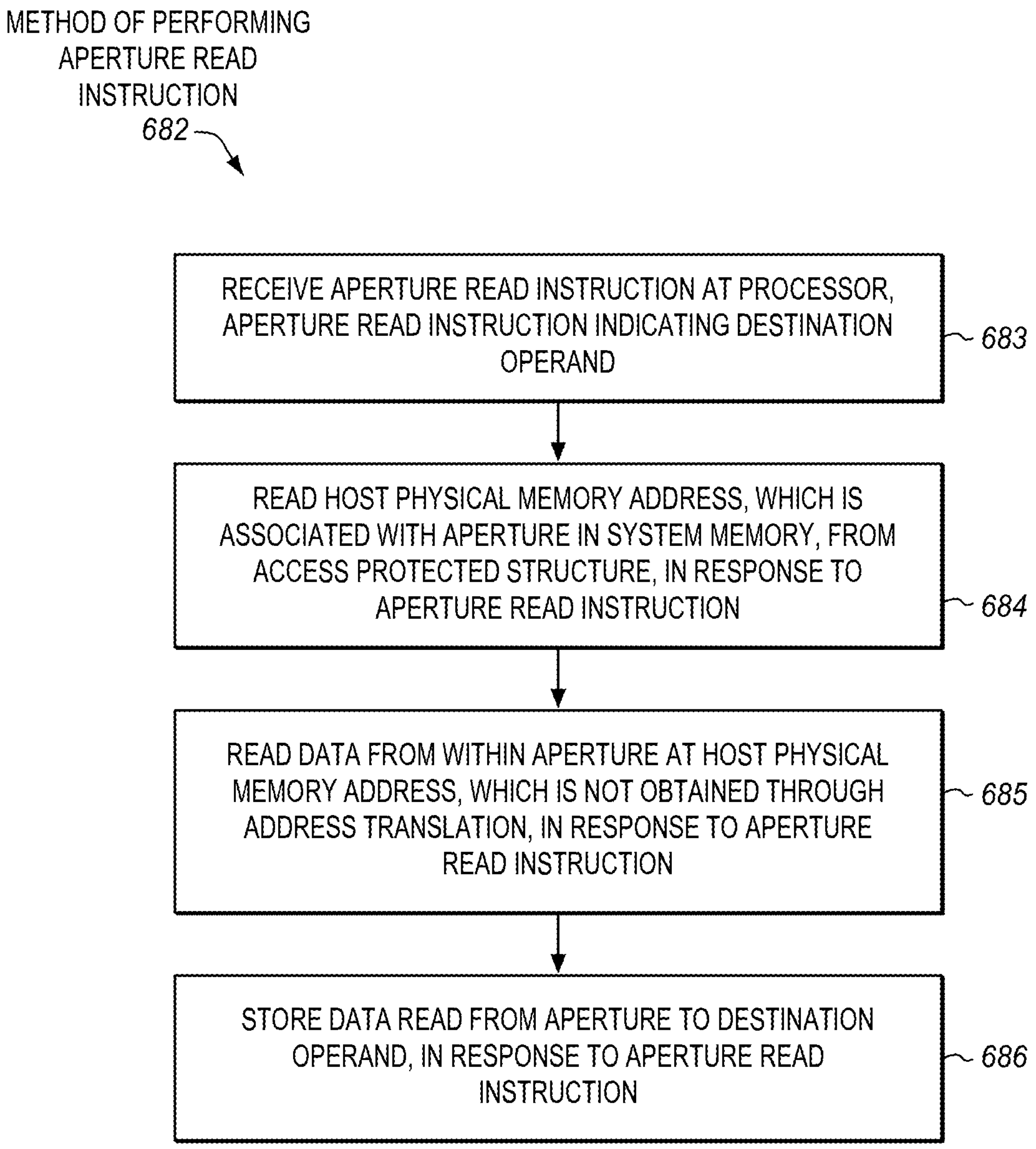
FIG. 6 is a block flow diagram of an embodiment of a method of performing an embodiment of an aperture read instruction.

FIG. 6 is a block flow diagram of an embodiment of a method 682 of performing an embodiment of an aperture read instruction. In various embodiments, the method may be performed by a processor, instruction processing apparatus, digital logic device, or integrated circuit.

The method includes receiving the aperture read instruction, at block 683. In various aspects, the instruction may be received at a processor or a portion thereof (e.g., an instruction fetch unit, a decode unit, a bus interface unit, etc.). In various aspects, the instruction may be received from an off-processor and/or off-die source (e.g., from memory, interconnect, etc.), or from an on-processor and/or on-die source (e.g., from an instruction cache, instruction queue, etc.).

The aperture read instruction may specify (e.g., explicitly specify through a field or other set of bits), or otherwise indicate (e.g., implicitly indicate), a destination operand. In some embodiments, the destination operand may optionally be in memory. In other embodiments, the destination operand may optionally be in a register of the processor. In still other embodiments, other destination storage locations may optionally be used.

At block 684, a host physical memory address, which is associated with an aperture in system memory, may be read from an access protected structure, in response to the aperture read instruction. The access protected structure may be similar to or the same as those discussed above. In some embodiments, the host physical memory address may not be exposed architecturally to software to which the aperture read instruction corresponds and/or may remain invisible to such software.

Then, at block 685, data from within the aperture at a host physical memory address may be read, in response to the aperture read instruction. In some embodiments, the host physical memory address from where the data is read may not have been obtained through address translation (e.g., may not have been obtained from a TLB, or by performing a page table walk, etc.). The host physical memory address read at block 684 may either be the same or different than the host physical memory address used to read the data at block 685, as previously described.

At block 686, the data read from the aperture may be stored to the destination operand, in response to the aperture write instruction. In one specific example embodiment, the amount of data may optionally be sixty-four bytes of data.

In other embodiments, the amount of data may optionally be either more or less than sixty-four bytes.

Figure 7:
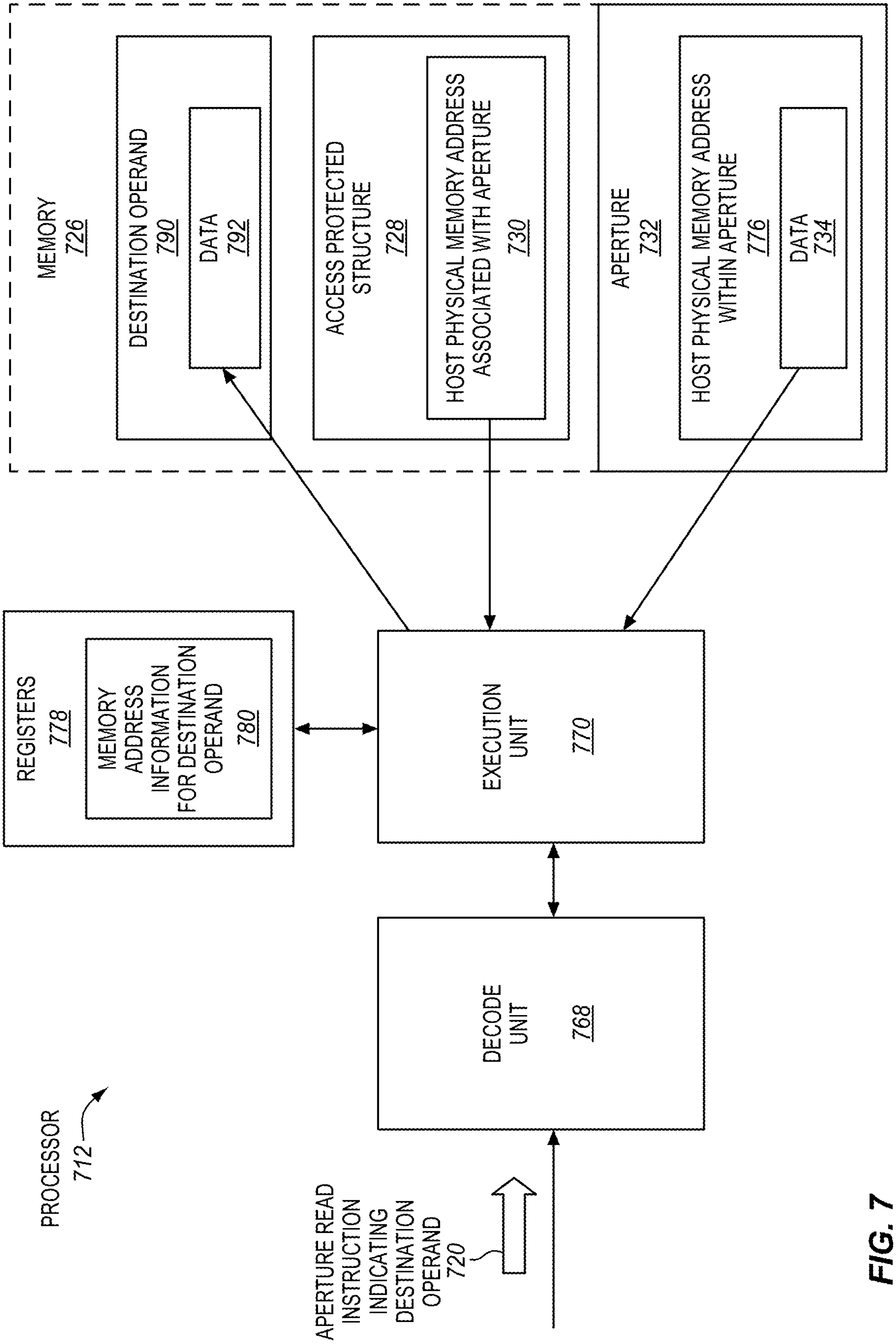
FIG. 7 is a block diagram of an embodiment of a processor that is operative to perform an embodiment of an aperture read instruction.

FIG. 7 is a block diagram of an embodiment of a processor 712 that is operative to perform an embodiment of an aperture read instruction 720. In some embodiments, the processor 712 may be operative to perform the method 682 of FIG. 6. The components, features, and specific optional details described herein for the processor 712 and/or the instruction 720, also optionally apply to the method 682. Alternatively, the method 682 may be performed by and/or within a similar or different processor or apparatus and/or using a similar or different instruction. Moreover, the processor 712 may be operative to perform methods similar to or different than the method 682.

The processor 712 may be the same as, similar to, or different than, the processor 512 of FIG. 5. The processor includes a decode unit 768 operative to decode the aperture read instruction 720, an execution unit 770 operative to perform the aperture read instruction, and registers 578 operative to store memory address information 780 for a destination operand 790 of the aperture read instruction 720. Aside from these aspects pertaining to the aperture read instruction, instead of or in addition to the aspects pertaining to the aperture write instruction 518, unless otherwise specified, these components may optionally be similar to, or the same as, (e.g., have characteristics that are the same or similar) the correspondingly named components of FIG. 5. Moreover, the aperture read instruction 720 may cause the processor 712 to interact with an access protected structure 728 and an aperture 732. Aside from any aspects pertaining only to the aperture read instruction, unless otherwise specified, these components may also optionally be similar to, or the same as, (e.g., have characteristics that are the same or similar) the correspondingly named components of FIG. 5. To avoid obscuring the description, the different and/or additional characteristics of the processor 712 and its components will primarily be described, without repeating all the characteristics which may optionally be the same.

During operation, the processor 712 may receive the aperture read instruction 720. In some embodiments, the aperture read instruction may explicitly specify, or otherwise indicate, a destination operand 790. By way of example, as shown in the illustrated example embodiment, the destination operand 790 may be stored in memory 726, and the aperture read instruction may specify or otherwise indicate one or more registers of a set of registers 778 having memory address information 780 to address the destination operand, although the scope of the invention is not so limited.

The decode unit 768 may receive and decode the aperture read instruction. The execution unit 770 is coupled with the decode unit 768 and is coupled with the registers 778. During operation, when deployed in a system, the execution unit may be operative to be coupled with the memory 726. The execution unit may be operative in response to and/or as a result of the aperture read instruction (e.g., in response to one or more instructions or control signals decoded from the instruction and/or in response to the instruction being decoded and/or in response to the instruction being provided to a decoder) to access or otherwise receive a host physical memory address 730 that is associated with an aperture 732. As shown, in some embodiments, the host physical memory address 730 may optionally be stored in an access protected structure 728. The access protected structure may be similar to, or the same as, (e.g., have characteristics that are the same or similar) those previously described (e.g., for the access protected structure 528).

The execution unit may also be operative in response to and/or as a result of the aperture read instruction to read data 734 from within the aperture 732 at a host physical memory address 776. The aperture may be similar to, or the same as, (e.g., have characteristics that are the same or similar) those previously discussed (e.g., for the aperture 532). In some embodiments, the host physical memory address 776 from which the data 734 is read within the aperture 732 may not have been obtained through address translation. The aperture read instruction may have special privileges within on-die logic of the processor to access the aperture by bypassing address translation. The host physical memory address 776 may be related to the host physical memory address 730 in various different ways, as previously described.

The execution unit may further be operative in response to and/or as a result of the aperture read instruction to store the data 734 received from the aperture 732 as data 792 in the destination operand 790. In one specific example embodiment, the amount of data may optionally be sixty-four bytes of data. In other embodiments, the amount of data may optionally be either more or less than sixty-four bytes.

Figure 8:
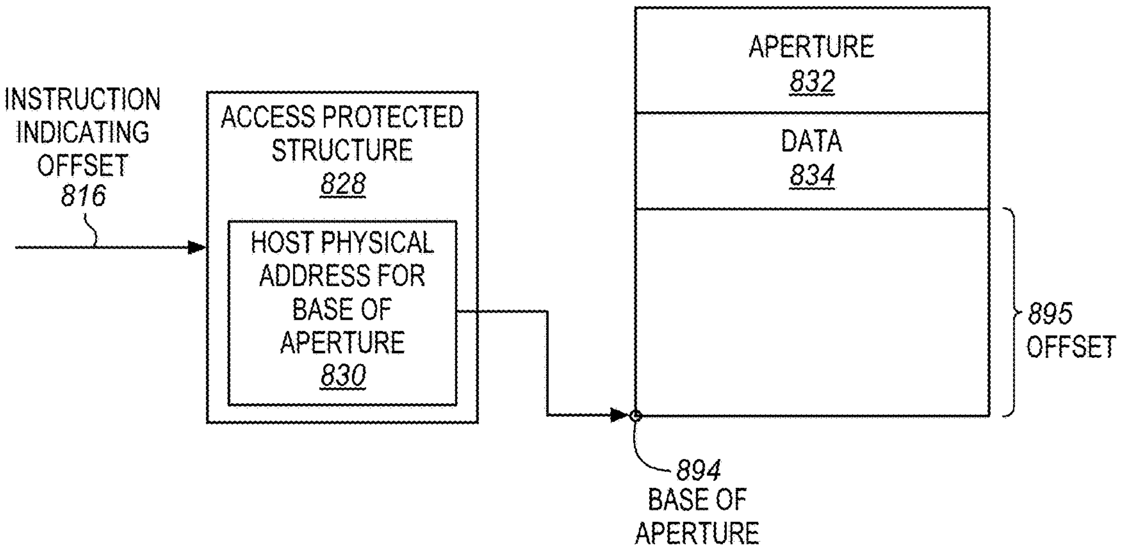
FIG. 8 is a block diagram of a first approach to access data from an aperture.

FIG. 8 is a block diagram of a first approach to access data 834 from an aperture 832. In this first approach, an aperture access instruction 816 may indicate an offset. The aperture access instruction may be used to access a host physical address 830 for a base 894 of the aperture 832 from an access protected structure 828. Then, the offset 895 indicated by the instruction may be applied to the base 894 to obtain the physical memory address or location of the data 834 within the aperture 832, which is to be accessed. The offset 895 may allow the aperture access instruction 816 to address or otherwise indicate and use different storage locations or portions of the aperture 832. Software may not ever know or learn the actual host physical address for the base 894 of the aperture, but may be able to indicate different offsets relative to the base to address different locations within the aperture.

Figure 9:
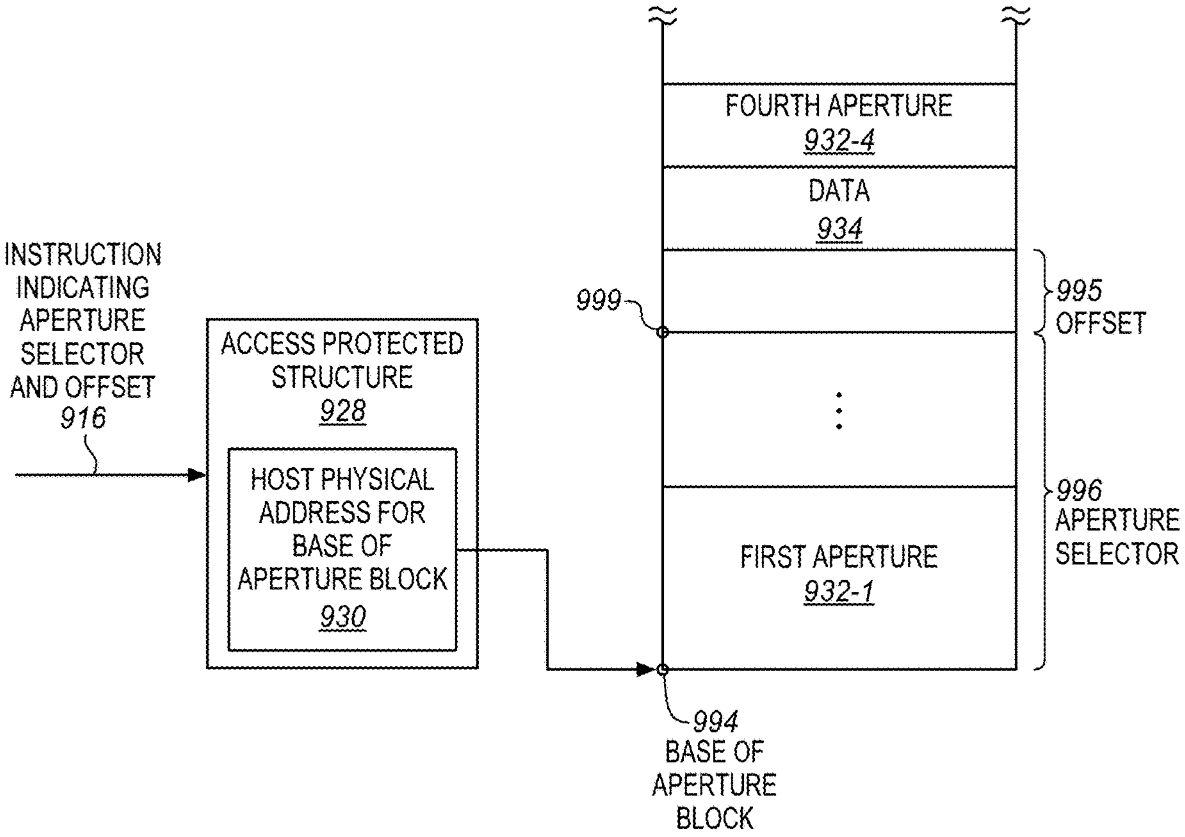
FIG. 9 is a block diagram of a second approach to access data from an aperture.

FIG. 9 is a block diagram of a second approach to access data 934 from an aperture 932-4. In this second approach, an aperture access instruction 916 may indicate an aperture selector and an offset. The aperture access instruction may be used to access a host physical address 930 for a base 994 of an aperture block from an access protected structure 928. The aperture block may include multiple different apertures in physical adjacent memory locations. In the illustrated example, a first aperture 932-1 through a fourth aperture 932-4 are shown, although there may optionally be fewer or more apertures. The aperture selector 996 indicated by the instruction may be used to select one of the apertures from the aperture block. In this example, the fourth aperture 932-4 is selected. Then, the offset 995 indicated by the instruction may be applied to the base 999 of the selected fourth aperture to obtain the physical memory address or location of the data 934 within the selected fourth aperture 932-4, which is to be accessed. The aperture selector 996 may allow different apertures to be selected and used. Such different apertures may be used for different purposes. By way of example, different apertures may be used for communication between different VMs, for different applications associated with the same or different VMs, or in other ways.

Figure 10:
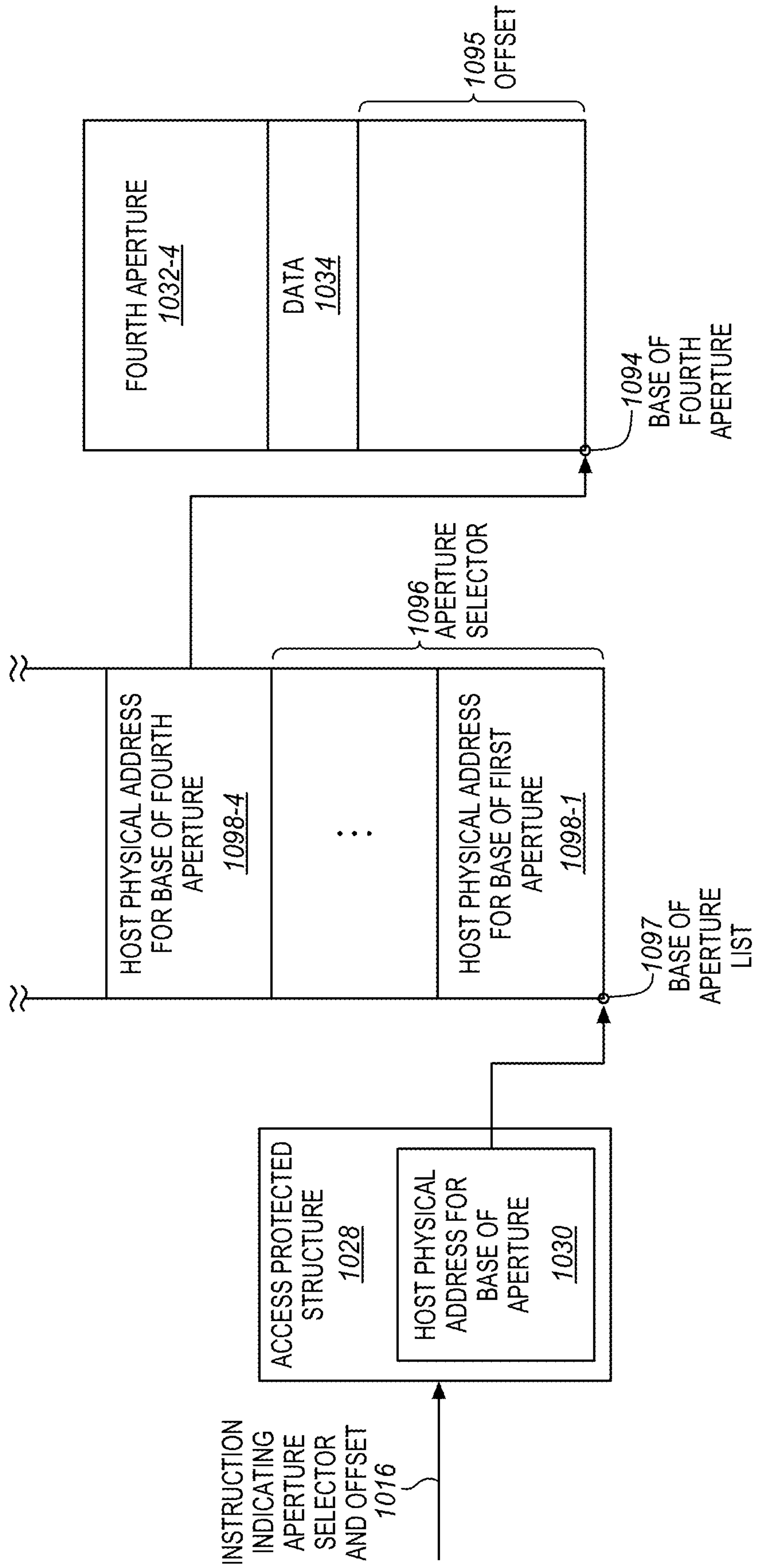
FIG. 10 is a block diagram a third approach to access data from an aperture.

FIG. 10 is a block diagram of a third approach to access data 1034 from an aperture 1032-4. In this third approach, an aperture access instruction 1016 may indicate an aperture selector and an offset. The aperture access instruction may be used to access a host physical address 1030 for a base 1097 of an aperture list from an access protected structure 1028. The aperture list may include a list of host physical addresses each needed to access a different corresponding one of a list of different apertures that may potentially/optionally be in different non-adjacent physical memory locations.

In the illustrated example, a first host physical memory address 1098-1 for a base of a first aperture through a fourth host physical memory address 1098-4 for a base of a fourth aperture are shown, although there may optionally be fewer or more. The aperture selector 1096 indicated by the instruction may be used to select one of the host physical memory addresses for a corresponding aperture from the aperture list. In this example, the fourth host physical memory address 1098-4 is selected. The fourth host physical memory address 1098-4 addresses a base 1094 of a fourth aperture 1032-4. Then, the offset 1095 indicated by the instruction may be applied to the base 1094 of the fourth aperture to obtain the physical memory address or location of the data 1034 within the selected fourth aperture 1032-4, which is to be accessed.

In some embodiments, with either of the approaches shown in FIGS. 8-10, a bounds check may optionally be performed to ensure that the offset when applied to the base falls within the extent of the aperture (e.g., as defined by a lower bound and an upper bound). If the attempted access is not fully within bounds, then the access may not be performed and special handing may be performed (e.g., a VM exit may be performed, an exception may be taken, or the like).

The aperture access instructions, apertures, and other approaches described herein may be used for various different applications and purposes. Examples include, but are not limited to, shared data processing, shared server processing, shared cloud computing, shared network processing, and the like. To further illustrate, consider one possible application in Network Function Virtualization (NFV). NFV generally involves virtualizing and running network functions (e.g., Virtual Network Functions (VNFs)) such as routing, switching, intelligent packet processing, and the like, on general Commercial-Off-The Shelf (COTS) systems, as opposed to fixed function network appliances. One key driving usage is Network Service Function Chaining (NSFC) to form a network processing pipeline. For example, packets may be passed through a series VNFs, such as deep packet inspection, network address translation, and other network functions, before they are forwarded to the next destination. Different virtual machines may potentially be used to perform different NSFC tasks, VNFs, or the like. The approaches described herein may potentially be used to share data processed by one virtual machine which has performed one NSFC task, VNF, or the like, with another virtual machine that is to perform another NSFC task, VNF, or the like. Another possible application is in Software Defined Networks (SDN) where two or more VMs may likewise cooperate and may want to share data. Still other possible applications are in Inter Process Communication (IPC) libraries, data plane processing applications, and software switching applications. These are just a few illustrative examples. The scope of the invention is not limited to any specific application.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-Of-Order Core Block Diagram

FIG. 11A is a block diagram illustrating both an exemplary in-order pipeline and an exemplary register renaming, out-of-order issue/execution pipeline according to embodiments of the invention. FIG. 11B is a block diagram illustrating both an exemplary embodiment of an in-order architecture core and an exemplary register renaming, out-of-order issue/execution architecture core to be included in a processor according to embodiments of the invention. The solid lined boxes in FIGS. 11A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 11A, a processor pipeline 1100 includes a fetch stage 1102, a length decode stage 1104, a decode stage 1106, an allocation stage 1108, a renaming stage 1110, a scheduling (also known as a dispatch or issue) stage 1112, a register read/memory read stage 1114, an execute stage 1116, a write back/memory write stage 1118, an exception handling stage 1122, and a commit stage 1124.

FIG. 11B shows processor core 1190 including a front end unit 1130 coupled to an execution engine unit 1150, and both are coupled to a memory unit 1170. The core 1190 may be a reduced instruction set computing (RISC) core, a complex instruction set computing (CISC) core, a very long instruction word (VLIW) core, or a hybrid or alternative core type. As yet another option, the core 1190 may be a special-purpose core, such as, for example, a network or communication core, compression engine, coprocessor core, general purpose computing graphics processing unit (GPGPU) core, graphics core, or the like.

The front end unit 1130 includes a branch prediction unit 1132 coupled to an instruction cache unit 1134, which is coupled to an instruction translation lookaside buffer (TLB) 1136, which is coupled to an instruction fetch unit 1138, which is coupled to a decode unit 1140. The decode unit 1140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1190 includes a microcode ROM or other medium that stores microcode for certain macroinstructions (e.g., in decode unit 1140 or otherwise within the front end unit 1130). The decode unit 1140 is coupled to a rename/allocator unit 1152 in the execution engine unit 1150.

The execution engine unit 1150 includes the rename/allocator unit 1152 coupled to a retirement unit 1154 and a set of one or more scheduler unit(s) 1156. The scheduler unit(s) 1156 represents any number of different schedulers, including reservations stations, central instruction window, etc. The scheduler unit(s) 1156 is coupled to the physical register file(s) unit(s) 1158. Each of the physical register file(s) units 1158 represents one or more physical register files, different ones of which store one or more different data types, such as scalar integer, scalar floating point, packed integer, packed floating point, vector integer, vector floating point,, status (e.g., an instruction pointer that is the address of the next instruction to be executed), etc. In one embodiment, the physical register file(s) unit 1158 comprises a vector registers unit, a write mask registers unit, and a scalar registers unit. These register units may provide architectural vector registers, vector mask registers, and general purpose registers. The physical register file(s) unit(s) 1158 is overlapped by the retirement unit 1154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1154 and the physical register file(s) unit(s) 1158 are coupled to the execution cluster(s) 1160. The execution cluster(s) 1160 includes a set of one or more execution units 1162 and a set of one or more memory access units 1164. The execution units 1162 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1156, physical register file(s) unit(s) 1158, and execution cluster(s) 1160 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1164). It should also be understood that where separate pipelines are used, one or more of these pipelines may be out-of-order issue/execution and the rest in-order.

The set of memory access units 1164 is coupled to the memory unit 1170, which includes a data TLB unit 1172 coupled to a data cache unit 1174 coupled to a level 2 (L2) cache unit 1176. In one exemplary embodiment, the memory access units 1164 may include a load unit, a store address unit, and a store data unit, each of which is coupled to the data TLB unit 1172 in the memory unit 1170. The instruction cache unit 1134 is further coupled to a level 2 (L2) cache unit 1176 in the memory unit 1170. The L2 cache unit 1176 is coupled to one or more other levels of cache and eventually to a main memory.

By way of example, the exemplary register renaming, out-of-order issue/execution core architecture may implement the pipeline 1100 as follows: 1) the instruction fetch 1138 performs the fetch and length decoding stages 1102 and 1104; 2) the decode unit 1140 performs the decode stage 1106; 3) the rename/allocator unit 1152 performs the allocation stage 1108 and renaming stage 1110; 4) the scheduler unit(s) 1156 performs the schedule stage 1112; 5) the physical register file(s) unit(s) 1158 and the memory unit 1170 perform the register read/memory read stage 1114; the execution cluster 1160 perform the execute stage 1116; 6) the memory unit 1170 and the physical register file(s) unit(s) 1158 perform the write back/memory write stage 1118; 7) various units may be involved in the exception handling stage 1122; and 8) the retirement unit 1154 and the physical register file(s) unit(s) 1158 perform the commit stage 1124.

The core 1190 may support one or more instructions sets (e.g., the x86 instruction set (with some extensions that have been added with newer versions); the MIPS instruction set of MIPS Technologies of Sunnyvale, CA; the ARM instruction set (with optional additional extensions such as NEON) of ARM Holdings of Sunnyvale, CA), including the instruction(s) described herein. In one embodiment, the core 1190 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1134/1174 and a shared L2 cache unit 1176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 12B:
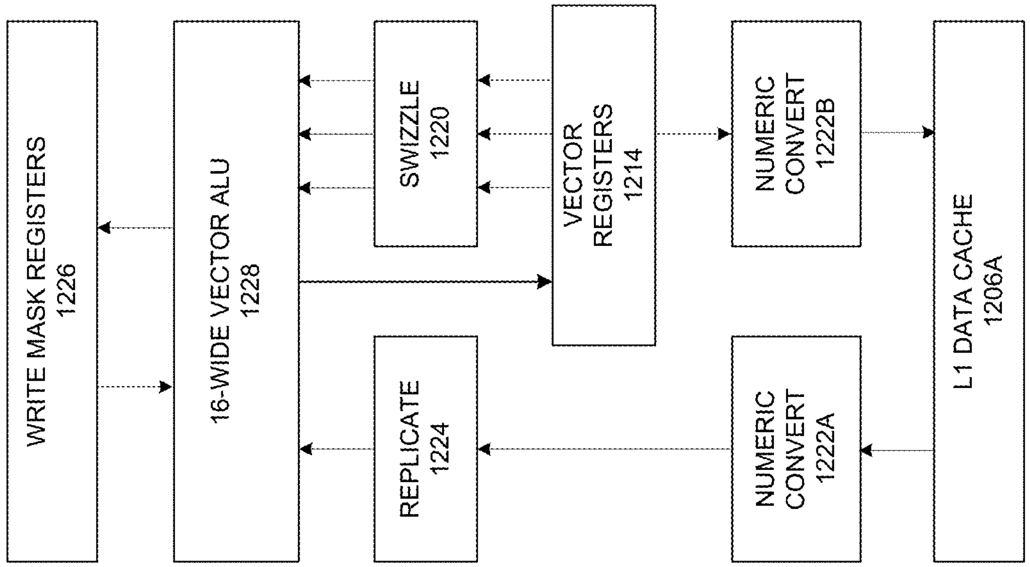
FIG. 12B is a block diagram of an embodiment of an expanded view of part of the processor core of FIG. 12A.
Figure 12A:
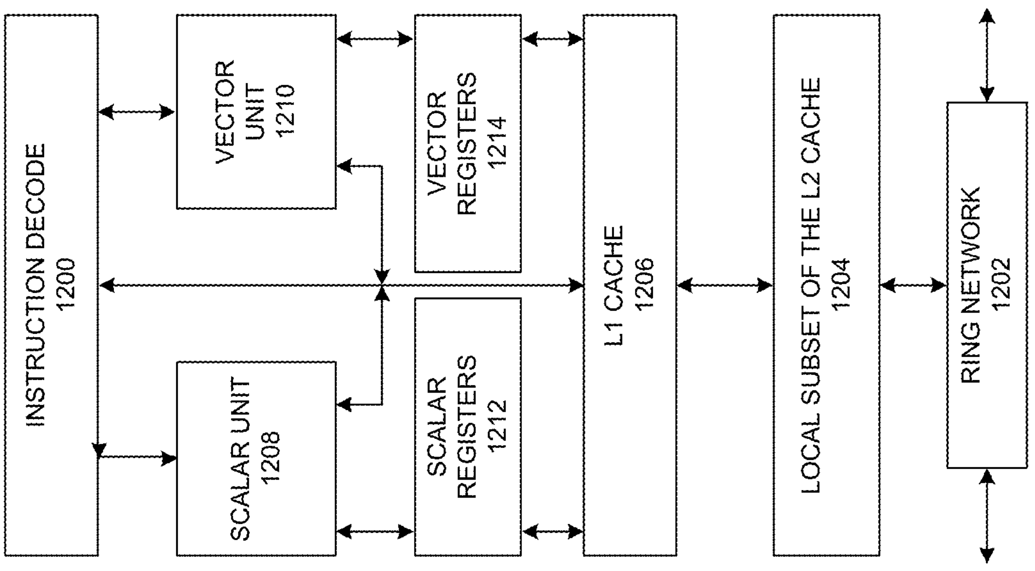
FIG. 12A is a block diagram of an embodiment of a single processor core, along with its connection to the on-die interconnect network, and with its local subset of the Level 2 (L2) cache.

FIGS. 12A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 12A is a block diagram of a single processor core, along with its connection to the on-die interconnect network 1202 and with its local subset of the Level 2 (L2) cache 1204, according to embodiments of the invention. In one embodiment, an instruction decoder 1200 supports the x86 instruction set with a packed data instruction set extension. An L1 cache 1206 allows low-latency accesses to cache memory into the scalar and vector units. While in one embodiment (to simplify the design), a scalar unit 1208 and a vector unit 1210 use separate register sets (respectively, scalar registers 1212 and vector registers 1214) and data transferred between them is written to memory and then read back in from a level 1 (L1) cache 1206, alternative embodiments of the invention may use a different approach (e.g., use a single register set or include a communication path that allow data to be transferred between the two register files without being written and read back).

The local subset of the L2 cache 1204 is part of a global L2 cache that is divided into separate local subsets, one per processor core. Each processor core has a direct access path to its own local subset of the L2 cache 1204. Data read by a processor core is stored in its L2 cache subset 1204 and can be accessed quickly, in parallel with other processor cores accessing their own local L2 cache subsets. Data written by a processor core is stored in its own L2 cache subset 1204 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 12B is an expanded view of part of the processor core in FIG. 12A according to embodiments of the invention. FIG. 12B includes an L1 data cache 1206A part of the L1 cache 1204, as well as more detail regarding the vector unit 1210 and the vector registers 1214. Specifically, the vector unit 1210 is a 16-wide vector processing unit (VPU) (see the 16-wid ALU 1228), which executes one or more of integer, single-precision float, and double-precision float instructions. The VPU supports swizzling the register inputs with swizzle unit 1220, numeric conversion with numeric convert units 1222A-B, and replication with replication unit 1224 on the memory input. Write mask registers 1226 allow predicating resulting vector writes.

Processor With Integrated Memory Controller and Graphics

Figure 13:
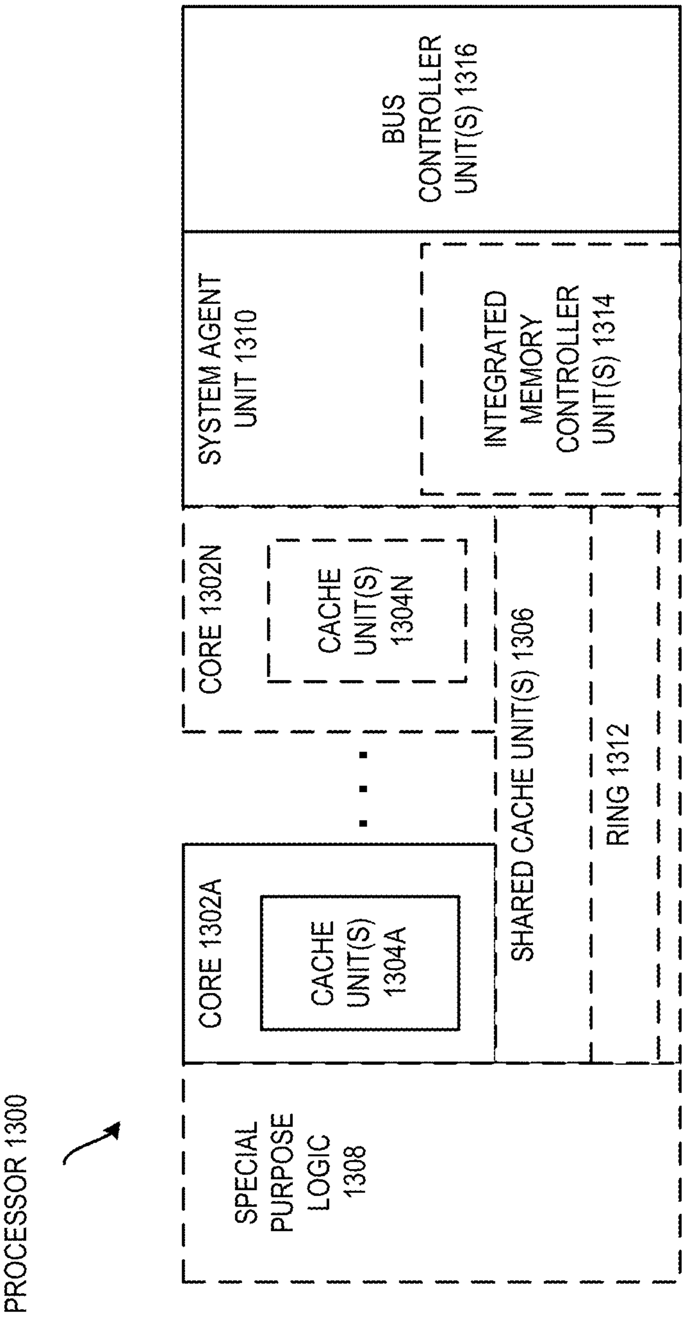
FIG. 13 is a block diagram of an embodiment of a processor that may have more than one core, may have an integrated memory controller, and may have integrated graphics.

FIG. 13 is a block diagram of a processor 1300 that may have more than one core, may have an integrated memory controller, and may have integrated graphics according to embodiments of the invention. The solid lined boxes in FIG. 13 illustrate a processor 1300 with a single core 1302A, a system agent 1310, a set of one or more bus controller units 1316, while the optional addition of the dashed lined boxes illustrates an alternative processor 1300 with multiple cores 1302A-N, a set of one or more integrated memory controller unit(s) 1314 in the system agent unit 1310, and special purpose logic 1308.

Thus, different implementations of the processor 1300 may include: 1) a CPU with the special purpose logic 1308 being integrated graphics and/or scientific (throughput) logic (which may include one or more cores), and the cores 1302A-N being one or more general purpose cores (e.g., general purpose in-order cores, general purpose out-of-order cores, a combination of the two); 2) a coprocessor with the cores 1302A-N being a large number of special purpose cores intended primarily for graphics and/or scientific (throughput); and 3) a coprocessor with the cores 1302A-N being a large number of general purpose in-order cores. Thus, the processor 1300 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1300 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1306, and external memory (not shown) coupled to the set of integrated memory controller units 1314. The set of shared cache units 1306 may include one or more mid-level caches, such as level 2 (L2), level 3 (L3), level 4 (L4), or other levels of cache, a last level cache (LLC), and/or combinations thereof. While in one embodiment a ring based interconnect unit 1312 interconnects the integrated graphics logic 1308, the set of shared cache units 1306, and the system agent unit 1310/integrated memory controller unit(s) 1314, alternative embodiments may use any number of well-known techniques for interconnecting such units. In one embodiment, coherency is maintained between one or more cache units 1306 and cores 1302-A-N.

In some embodiments, one or more of the cores 1302A-N are capable of multi-threading. The system agent 1310 includes those components coordinating and operating cores 1302A-N. The system agent unit 1310 may include for example a power control unit (PCU) and a display unit. The PCU may be or include logic and components needed for regulating the power state of the cores 1302A-N and the integrated graphics logic 1308. The display unit is for driving one or more externally connected displays.

The cores 1302A-N may be homogenous or heterogeneous in terms of architecture instruction set; that is, two or more of the cores 1302A-N may be capable of execution the same instruction set, while others may be capable of executing only a subset of that instruction set or a different instruction set.

Exemplary Computer Architectures

FIGS. 14-17 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 14:
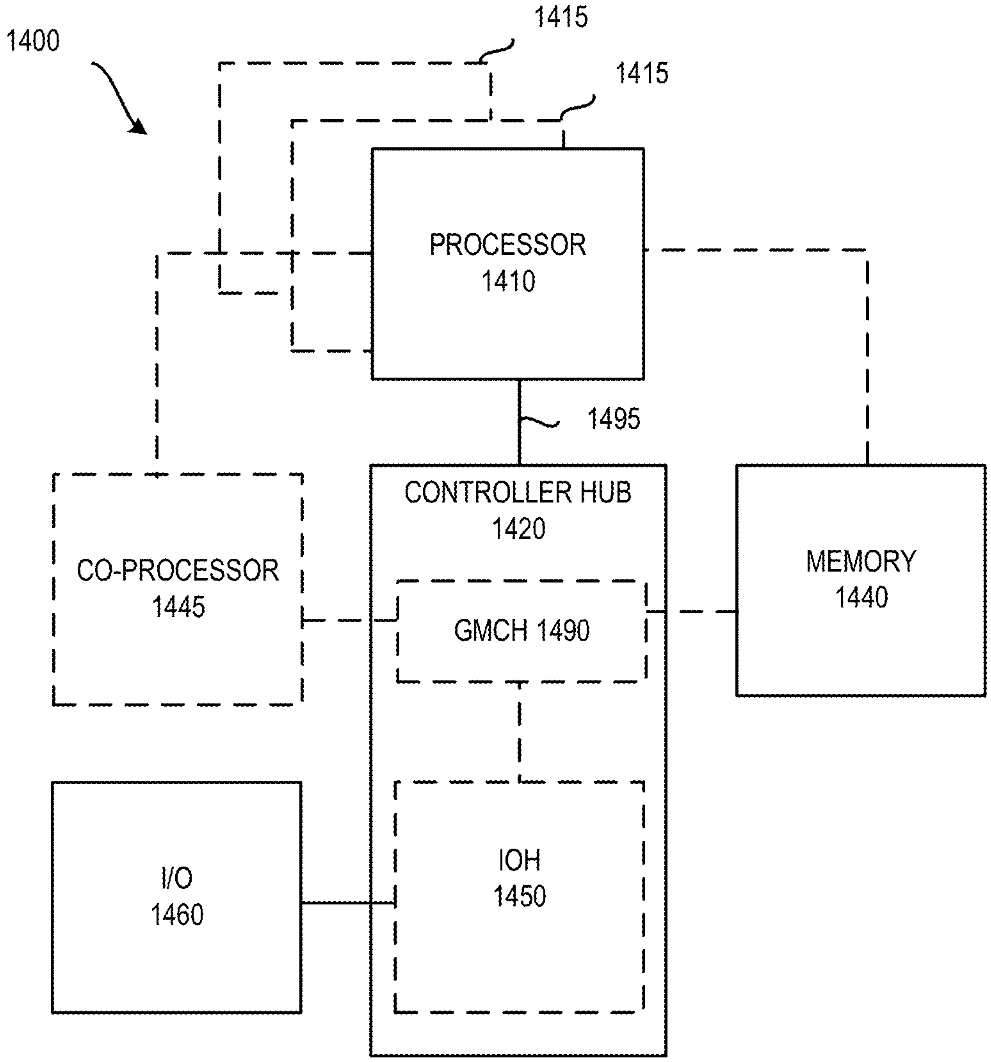
FIG. 14 is a block diagram of a first embodiment of a computer architecture.

Referring now to FIG. 14, shown is a block diagram of a system 1400 in accordance with one embodiment of the present invention. The system 1400 may include one or more processors 1410, 1415, which are coupled to a controller hub 1420. In one embodiment the controller hub 1420 includes a graphics memory controller hub (GMCH) 1490 and an Input/Output Hub (IOH) 1450 (which may be on separate chips); the GMCH 1490 includes memory and graphics controllers to which are coupled memory 1440 and a coprocessor 1445; the IOH 1450 is couples input/output (I/O) devices 1460 to the GMCH 1490. Alternatively, one or both of the memory and graphics controllers are integrated within the processor (as described herein), the memory 1440 and the coprocessor 1445 are coupled directly to the processor 1410, and the controller hub 1420 in a single chip with the IOH 1450.

The optional nature of additional processors 1415 is denoted in FIG. 14 with broken lines. Each processor 1410, 1415 may include one or more of the processing cores described herein and may be some version of the processor 1300.

The memory 1440 may be, for example, dynamic random access memory (DRAM), phase change memory (PCM), or a combination of the two. For at least one embodiment, the controller hub 1420 communicates with the processor(s) 1410, 1415 via a multi-drop bus, such as a frontside bus (FSB), point-to-point interface such as QuickPath Interconnect (QPI), or similar connection 1495.

In one embodiment, the coprocessor 1445 is a special-purpose processor, such as, for example, a high-throughput MIC processor, a network or communication processor, compression engine, graphics processor, GPGPU, embedded processor, or the like. In one embodiment, controller hub 1420 may include an integrated graphics accelerator.

There can be a variety of differences between the physical resources 1410, 1415 in terms of a spectrum of metrics of merit including architectural, microarchitectural, thermal, power consumption characteristics, and the like.

In one embodiment, the processor 1410 executes instructions that control data processing operations of a general type. Embedded within the instructions may be coprocessor instructions. The processor 1410 recognizes these coprocessor instructions as being of a type that should be executed by the attached coprocessor 1445. Accordingly, the processor 1410 issues these coprocessor instructions (or control signals representing coprocessor instructions) on a coprocessor bus or other interconnect, to coprocessor 1445. Coprocessor(s) 1445 accept and execute the received coprocessor instructions.

Figure 15:
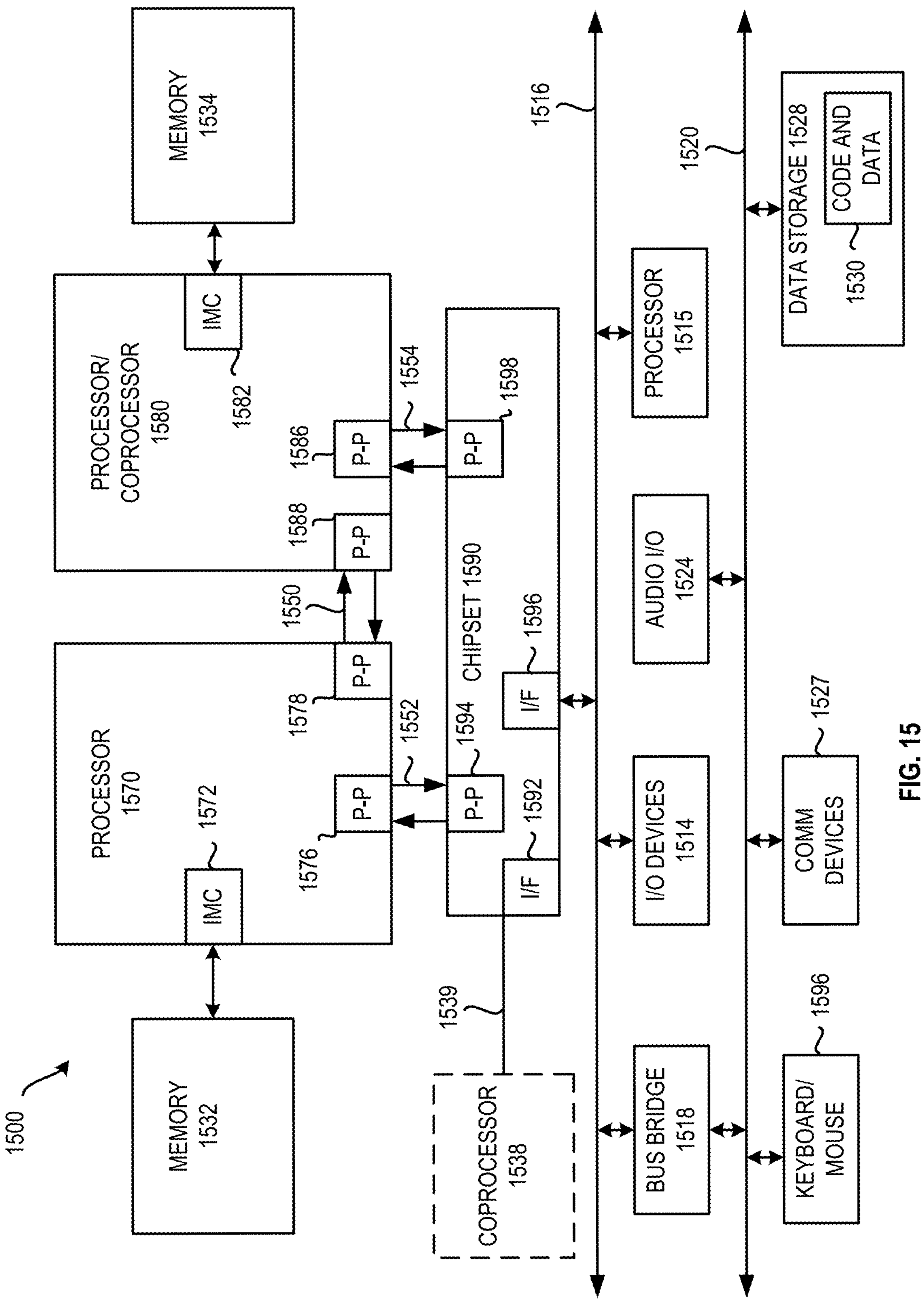
FIG. 15 is a block diagram of a second embodiment of a computer architecture.

Referring now to FIG. 15, shown is a block diagram of a first more specific exemplary system 1500 in accordance with an embodiment of the present invention. As shown in FIG. 15, multiprocessor system 1500 is a point-to-point interconnect system, and includes a first processor 1570 and a second processor 1580 coupled via a point-to-point interconnect 1550. Each of processors 1570 and 1580 may be some version of the processor 1300. In one embodiment of the invention, processors 1570 and 1580 are respectively processors 1410 and 1415, while coprocessor 1538 is coprocessor 1445. In another embodiment, processors 1570 and 1580 are respectively processor 1410 coprocessor 1445.

Processors 1570 and 1580 are shown including integrated memory controller (IMC) units 1572 and 1582, respectively. Processor 1570 also includes as part of its bus controller units point-to-point (P-P) interfaces 1576 and 1578; similarly, second processor 1580 includes P-P interfaces 1586 and 1588. Processors 1570, 1580 may exchange information via a point-to-point (P-P) interface 1550 using P-P interface circuits 1578, 1588. As shown in FIG. 15, IMCs 1572 and 1582 couple the processors to respective memories, namely a memory 1532 and a memory 1534, which may be portions of main memory locally attached to the respective processors.

Processors 1570, 1580 may each exchange information with a chipset 1590 via individual P-P interfaces 1552, 1554 using point to point interface circuits 1576, 1594, 1586, 1598. Chipset 1590 may optionally exchange information with the coprocessor 1538 via a high-performance interface 1539. In one embodiment, the coprocessor 1538 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1590 may be coupled to a first bus 1516 via an interface 1596. In one embodiment, first bus 1516 may be a Peripheral Component Interconnect (PCI) bus, or a bus such as a PCI Express bus or another third generation I/O interconnect bus, although the scope of the present invention is not so limited.

As shown in FIG. 15, various I/O devices 1514 may be coupled to first bus 1516, along with a bus bridge 1518 which couples first bus 1516 to a second bus 1520. In one embodiment, one or more additional processor(s) 1515, such as coprocessors, high-throughput MIC processors, GPGPU's, accelerators (such as, e.g., graphics accelerators or digital signal processing (DSP) units), field programmable gate arrays, or any other processor, are coupled to first bus 1516. In one embodiment, second bus 1520 may be a low pin count (LPC) bus. Various devices may be coupled to a second bus 1520 including, for example, a keyboard and/or mouse 1522, communication devices 1527 and a storage unit 1528 such as a disk drive or other mass storage device which may include instructions/code and data 1530, in one embodiment. Further, an audio I/O 1524 may be coupled to the second bus 1520. Note that other architectures are possible. For example, instead of the point-to-point architecture of FIG. 15, a system may implement a multi-drop bus or other such architecture.

Figure 16:
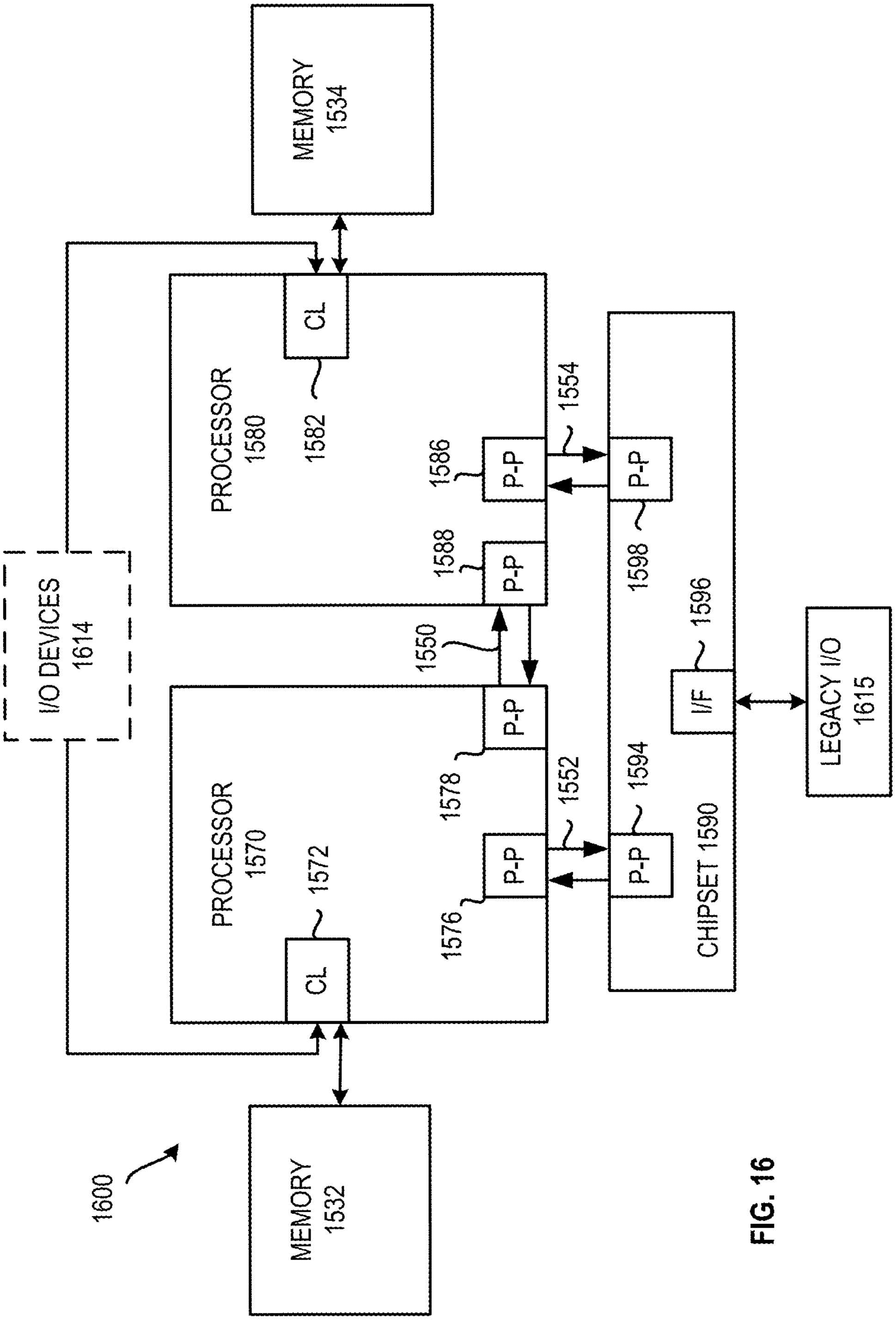
FIG. 16 is a block diagram of a third embodiment of a computer architecture.

Referring now to FIG. 16, shown is a block diagram of a second more specific exemplary system 1600 in accordance with an embodiment of the present invention. Like elements in FIGS. 15 and 16 bear like reference numerals, and certain aspects of FIG. 15 have been omitted from FIG. 16 in order to avoid obscuring other aspects of FIG. 16.

FIG. 16 illustrates that the processors 1570, 1580 may include integrated memory and I/O control logic ("CL") 1572 and 1582, respectively. Thus, the CL 1572, 1582 include integrated memory controller units and include I/O control logic. FIG. 16 illustrates that not only are the memories 1532, 1534 coupled to the CL 1572, 1582, but also that I/O devices 1614 are also coupled to the control logic 1572, 1582. Legacy I/O devices 1615 are coupled to the chipset 1590.

Figure 17:
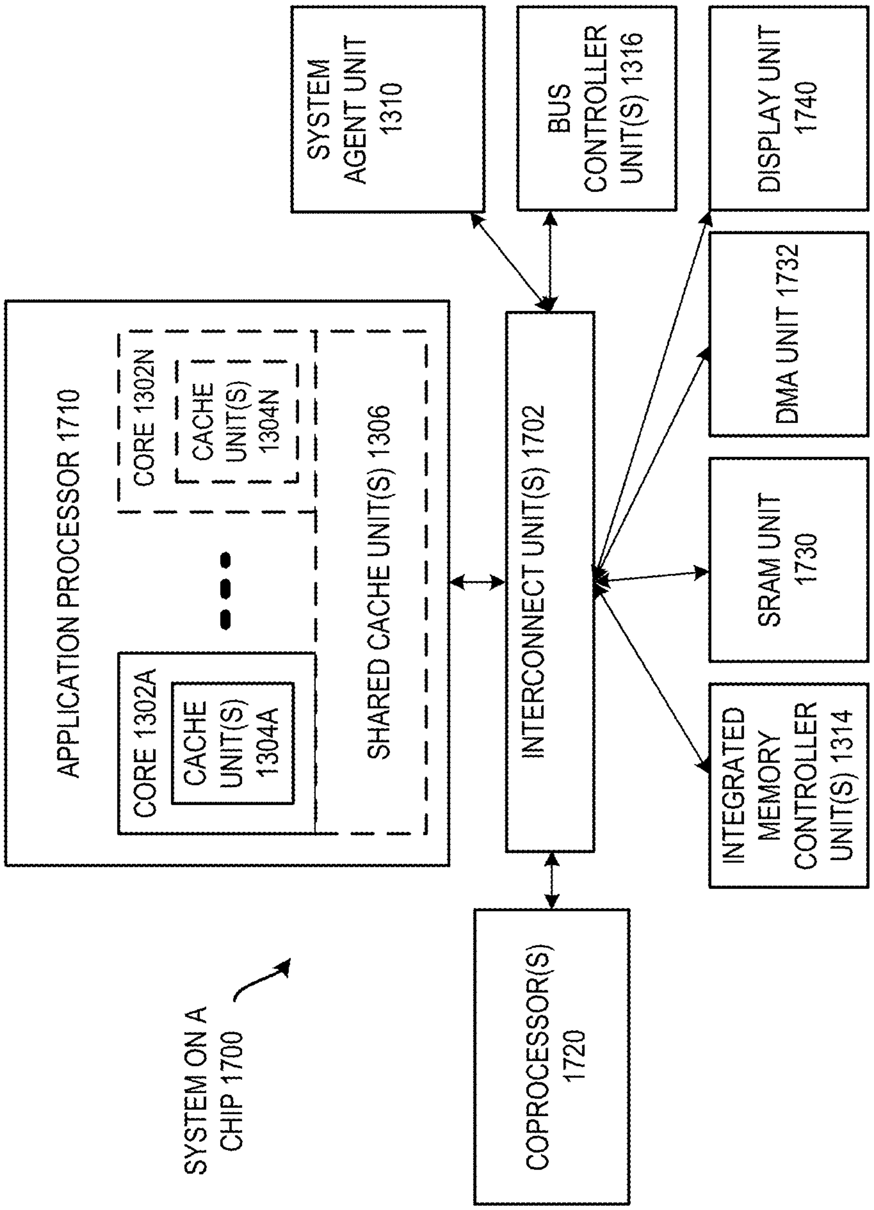
FIG. 17 is a block diagram of an embodiment of a system-on-a-chip architecture.

Referring now to FIG. 17, shown is a block diagram of a SoC 1700 in accordance with an embodiment of the present invention. Similar elements in FIG. 13 bear like reference numerals. Also, dashed lined boxes are optional features on more advanced SoCs. In FIG. 17, an interconnect unit(s) 1702 is coupled to: an application processor 1710 which includes a set of one or more cores 202A-N and shared cache unit(s) 1306; a system agent unit 1310; a bus controller unit(s) 1316; an integrated memory controller unit(s) 1314; a set or one or more coprocessors 1720 which may include integrated graphics logic, an image processor, an audio processor, and a video processor; an static random access memory (SRAM) unit 1730; a direct memory access (DMA) unit 1732; and a display unit 1740 for coupling to one or more external displays. In one embodiment, the coprocessor(s) 1720 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1530 illustrated in FIG. 15, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 18:
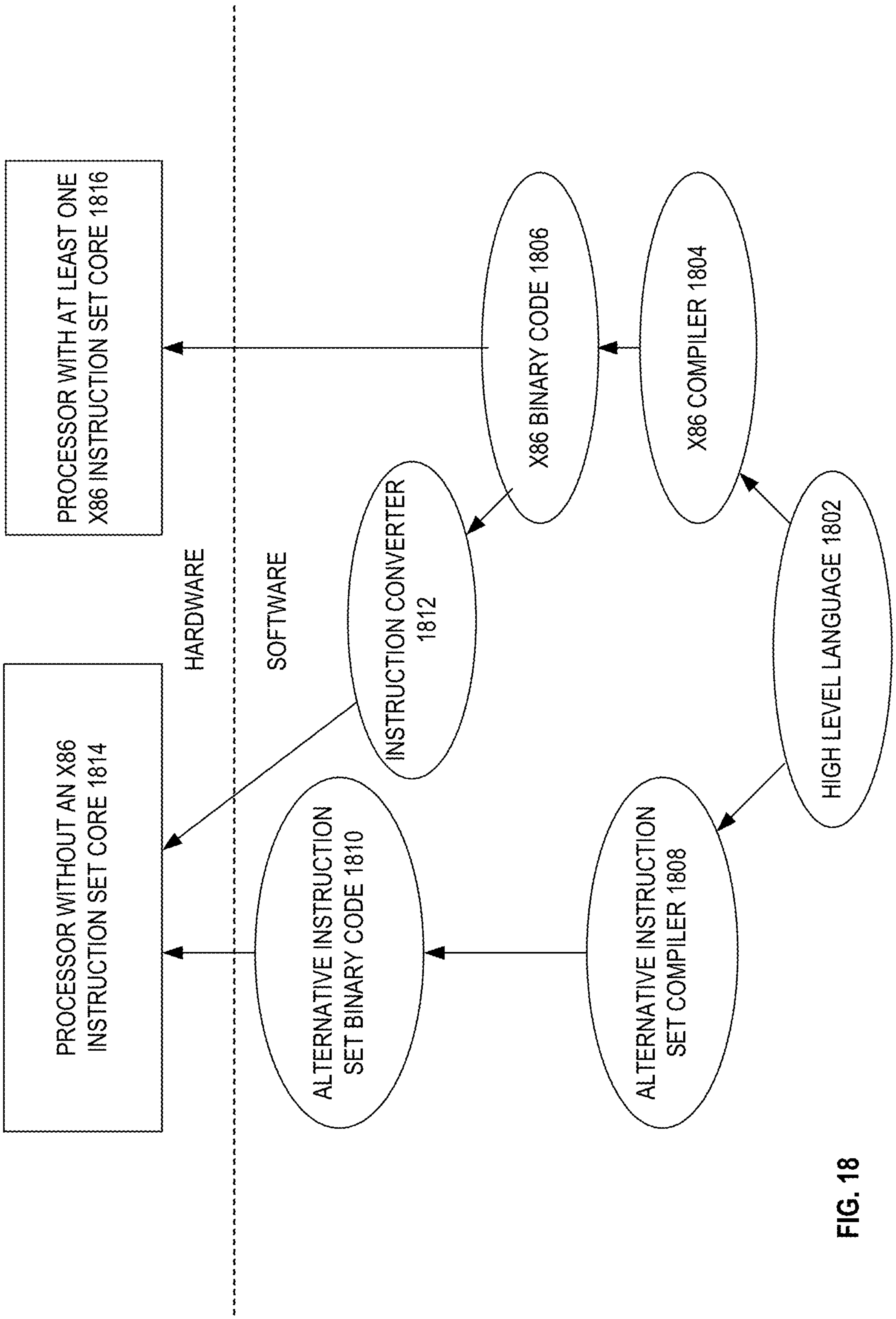
FIG. 18 is a block diagram of use of a software instruction converter to convert binary instructions in a source instruction set to binary instructions in a target instruction set, according to embodiments of the invention.

FIG. 18 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 18 shows a program in a high level language 1802 may be compiled using an x86 compiler 1804 to generate x86 binary code 1806 that may be natively executed by a processor with at least one x86 instruction set core 1816. The processor with at least one x86 instruction set core 1816 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1804 represents a compiler that is operable to generate x86 binary code 1806 (e.g., object code) that can, with or without additional linkage processing, be executed on the processor with at least one x86 instruction set core 1816. Similarly, FIG. 18 shows the program in the high level language 1802 may be compiled using an alternative instruction set compiler 1808 to generate alternative instruction set binary code 1810 that may be natively executed by a processor without at least one x86 instruction set core 1814 (e.g., a processor with cores that execute the MIPS instruction set of MIPS Technologies of Sunnyvale, CA and/or that execute the ARM instruction set of ARM Holdings of Sunnyvale, CA). The instruction converter 1812 is used to convert the x86 binary code 1806 into code that may be natively executed by the processor without an x86 instruction set core 1814. This converted code is not likely to be the same as the alternative instruction set binary code 1810 because an instruction converter capable of this is difficult to make; however, the converted code will accomplish the general operation and be made up of instructions from the alternative instruction set. Thus, the instruction converter 1812 represents software, firmware, hardware, or a combination thereof that, through emulation, simulation or any other process, allows a processor or other electronic device that does not have an x86 instruction set processor or core to execute the x86 binary code 1806.

Components, features, and details described for any of the processors disclosed herein may optionally apply to any of the methods disclosed herein, which in embodiments may optionally be performed by and/or with such processors. Any of the processors described herein in embodiments may optionally be included in any of the systems disclosed herein. Any of the instructions disclosed herein in embodiments may optionally be performed by and/or with any of the processors disclosed herein, optionally in some embodiments having any of the microarchitectures shown herein, and optionally in some embodiments included in any of the systems shown herein. Accordingly, features and details described for any of the instructions disclosed herein may in some embodiments therefore optionally apply to any of the processors and/or systems disclosed herein which may be used to perform those instructions.

Processor components disclosed herein may be said to be operative, configured, capable, or able to perform an operation. For example, a decoder may be to decode an instruction, an execution unit may be to store a result, etc. For clarity, it is to be understood that these expressions do not imply that the processor components are in operation or use, but rather refer to what the processor components are capable of doing or able to do when they are in operation, but in the apparatus claims these processor components are not in operation.

In the description and claims, the terms "coupled" and/or "connected," along with their derivatives, may have be used. These terms are not intended as synonyms for each other. Rather, in embodiments, "connected" may be used to indicate that two or more elements are in direct physical and/or electrical contact with each other. "Coupled" may mean that two or more elements are in direct physical and/or electrical contact with each other. However, "coupled" may also mean that two or more elements are not in direct contact with each other, but yet still co-operate or interact with each other. For example, an execution unit may be coupled with a register and/or a decode unit through one or more intervening components. In the figures, arrows are used to show connections and couplings.

The components disclosed herein and the methods depicted in the preceding figures may be implemented with logic, modules, or units that includes hardware (e.g., transistors, gates, circuitry, etc.), firmware (e.g., a non-volatile memory storing microcode or control signals), software (e.g., stored on a non-transitory computer readable storage medium), or a combination thereof. In some embodiments, the logic, modules, or units may include at least some or predominantly a mixture of hardware and/or firmware potentially combined with some optional software.

The term "and/or" may have been used. As used herein, the term "and/or" means one or the other or both (e.g., A and/or B means A or B or both A and B).

In the description above, specific details have been set forth in order to provide a thorough understanding of the embodiments. However, other embodiments may be practiced without some of these specific details. The scope of the invention is not to be determined by the specific examples provided above, but only by the claims below. In other instances, well-known circuits, structures, devices, and operations have been shown in block diagram form and/or without detail in order to avoid obscuring the understanding of the description. Where considered appropriate, reference numerals, or terminal portions of reference numerals, have been repeated among the figures to indicate corresponding or analogous elements, which may optionally have similar or the same characteristics, unless specified or clearly apparent otherwise.

Certain operations may be performed by hardware components, or may be embodied in machine-executable or circuit-executable instructions, that may be used to cause and/or result in a machine, circuit, or hardware component (e.g., a processor, potion of a processor, circuit, etc.) programmed with the instructions performing the operations. The operations may also optionally be performed by a combination of hardware and software. A processor, machine, circuit, or hardware may include specific or particular circuitry or other logic (e.g., hardware potentially combined with firmware and/or software) is operative to execute and/or process the instruction and store a result in response to the instruction.

Some embodiments include an article of manufacture (e.g., a computer program product) that includes a machine-readable medium. The medium may include a mechanism that provides, for example stores, information in a form that is readable by the machine. The machine-readable medium may provide, or have stored thereon, an instruction or sequence of instructions, that if and/or when executed by a machine are operative to cause the machine to perform and/or result in the machine performing one or operations, methods, or techniques disclosed herein.

In some embodiments, the machine-readable medium may include a tangible and/or non-transitory machine-readable storage medium. For example, the non-transitory machine-readable storage medium may include a floppy diskette, an optical storage medium, an optical disk, an optical data storage device, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, a phase-change data storage material, a non-volatile memory, a non-volatile data storage device, a non-transitory memory, a non-transitory data storage device, or the like. The non-transitory machine-readable storage medium does not consist of a transitory propagated signal. In some embodiments, the storage medium may include a tangible medium that includes solid-state matter or material, such as, for example, a semiconductor material, a phase change material, a magnetic solid material, a solid data storage material, etc. Alternatively, a non-tangible transitory computer-readable transmission media, such as, for example, an electrical, optical, acoustical or other form of propagated signals-such as carrier waves, infrared signals, and digital signals, may optionally be used.

Examples of suitable machines include, but are not limited to, a general-purpose processor, a special-purpose processor, a digital logic circuit, an integrated circuit, or the like. Still other examples of suitable machines include a computer system or other electronic device that includes a processor, a digital logic circuit, or an integrated circuit. Examples of such computer systems or electronic devices include, but are not limited to, desktop computers, laptop computers, notebook computers, tablet computers, netbooks, smartphones, cellular phones, servers, network devices (e.g., routers and switches.), Mobile Internet devices (MIDs), media players, smart televisions, nettops, set-top boxes, and video game controllers.

Reference throughout this specification to "one embodiment," "an embodiment," "one or more embodiments," "some embodiments," for example, indicates that a particular feature may be included in the practice of the invention but is not necessarily required to be. Similarly, in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects lie in less than all features of a single disclosed embodiment. Thus, the claims following the Detailed Description are hereby expressly incorporated into this Detailed Description, with each claim standing on its own as a separate embodiment of the invention.

EXAMPLE EMBODIMENTS

The following examples pertain to further embodiments. Specifics in the examples may be used anywhere in one or more embodiments.

Example 1 is a processor including a decode unit to decode an aperture access instruction and an execution unit coupled with the decode unit. The execution unit, in response to the aperture access instruction, to read a host physical memory address, which is to be associated with an aperture that is to be in system memory, from an access protected structure, and access data within the aperture at a host physical memory address that is not to be obtained through address translation.

Example 2 includes the processor of Example 1, optionally in which the aperture is to represent a portion of the system memory that is not to be accessible through the address translation.

Example 3 includes the processor of Example 1, optionally in which the decode unit is to decode the aperture access instruction which is to be an aperture write instruction, optionally in which the aperture write instruction is to indicate a source operand, and optionally in which the execution unit, in response to the aperture write instruction, is to receive the data from the source operand, and is to store the data from the source operand to the host physical memory address within the aperture.

Example 4 includes the processor of Example 3, optionally in which the source operand is to be in the system memory, and optionally in which the execution unit, in response to the aperture write instruction, is to perform address translation to obtain a host physical memory address to be used to receive the data from the source operand.

Example 5 includes the processor of Example 1, optionally in which the decode unit is to decode the aperture access instruction which is to be an aperture read instruction, optionally in which the aperture read instruction is to indicate a destination operand, and optionally in which the execution unit, in response to the aperture read instruction, is to read the data from the host physical memory address within the aperture, and is to store the data read from the aperture to the destination operand.

Example 6 includes the processor of any one of Examples 1 to 5, optionally in which the execution unit, in response to the aperture access instruction, is to read the host physical memory address from the access protected structure, which is to comprise a virtual machine control structure.

Example 7 includes the processor of any one of Examples 1 to 5, optionally in which the decoder is to decode at least one load from memory instruction that if performed is not to be allowed to read the host physical memory address associated with the aperture from the access protected structure.

Example 8 includes the processor of any one of Examples 1 to 5, optionally in which the execution unit, in response to the aperture access instruction, is to read the host physical memory address from the access protected structure, which is to be stored in the system memory, and optionally in which the decode unit is to decode the aperture access instruction that is not to indicate any architecturally visible memory address information for the access protected structure.

Example 9 includes the processor of any one of Examples 1 to 5, optionally in which the decode unit is to decode the aperture access instruction which is to indicate an offset, and optionally in which the execution unit, in response to the aperture access instruction, is to access the data within the aperture at the host physical memory address, which is to differ by the offset from a host physical memory address corresponding to a base of the aperture.

Example 10 includes the processor of any one of Examples 1 to 5, optionally in which the execution unit, in response to the aperture access instruction, is to read, from the access protected structure, the host physical memory address, which is to represent a host physical memory address for a base of a block of apertures that is to include a plurality of adjacent apertures.

Example 11 includes the processor of Example 10, optionally in which the decode unit is to decode the aperture access instruction that is to indicate an aperture selector to select one of the plurality of apertures.

Example 12 includes the processor of any one of Examples 1 to 5, optionally in which the execution unit, in response to the aperture access instruction, is to read, from the access protected structure, the host physical memory address, which is to represent a host physical memory address for a base of an aperture list, and optionally in which the aperture list is to store a plurality of host physical memory addresses each for a base of a different one of a plurality of potentially non-adjacent apertures.

Example 13 includes the processor of Example 12, optionally in which the decode unit is to decode the aperture access instruction that is to indicate an aperture selector to select one of the plurality of apertures.

Example 14 is a method performed by a processor including receiving an aperture write instruction at the processor, the aperture write instruction indicating a source operand, reading a host physical memory address, which is associated with an aperture in system memory, from an access protected structure, in response to the aperture write instruction, and storing data received from the source operand within the aperture to a host physical memory address that is not obtained through address translation, in response to the aperture write instruction.

Example 15 includes the method of Example 14, further including receiving an aperture read instruction at the processor, the aperture read instruction indicating a destination operand, reading the host physical memory address, which is associated with the aperture in the system memory, from the access protected structure, in response to the aperture read instruction, reading the data from within the aperture at the host physical memory address that is not obtained through address translation, in response to the aperture read instruction, and storing the data read from the aperture to the destination operand.

Example 16 includes the method of Example 15, further including issuing the aperture write instruction from a first virtual machine, issuing the aperture read instruction from a second virtual machine, and optionally in which the aperture write instruction and the aperture read instruction are used to share the data between the first virtual machine and the second virtual machine.

Example 17 includes the method of Example 14, further including preventing the host physical memory address where the data received from the source operand is stored from being reachable through second level hierarchical paging structures.

Example 18 includes the method of Example 14, performed by a virtual machine, and optionally in which the virtual machine is prevented from knowing the host physical memory address where the data received from the source operand is stored.

Example 19 is an article of manufacture including a non-transitory machine-readable storage medium, the non-transitory machine-readable storage medium storing instructions that if executed by a machine are to cause the machine to perform operations including allocate a region of system memory for an aperture, store a host physical memory address, which is to be associated with the aperture, in an access protected structure, and make host physical memory addresses of the aperture not accessible through a second level of hierarchical paging structures.

Example 20 includes the article of manufacture of Example 19, optionally in which the instructions to store the host physical memory address further comprise instructions that if executed by the machine are to cause the machine to perform operations including store the host physical memory address in the access protected structure which is to comprise a virtual machine control structure.

Example 21 includes the article of manufacture of any one of Examples 19 to 20, optionally in which the instructions to store the host physical memory address further comprise instructions that if executed by the machine are to cause the machine to perform operations including store the host physical memory address in the access protected structure, which is to correspond to a first virtual machine, and store the host physical memory address in a second access protected structure, which is to correspond to a second virtual machine.

Example 22 is a system to process instructions including an interconnect. The system also includes a processor coupled with the interconnect, the processor to receive an aperture access instruction, the processor, in response to the aperture access instruction, to read a host physical memory address, which is to be associated with an aperture that is to be in system memory, from an access protected structure, and access data within the aperture at a host physical memory address that is not to be obtained through address translation, and a dynamic random access memory (DRAM) coupled with the interconnect.

Example 23 includes the system of Example 22, optionally in which the aperture is to represent a portion of the system memory that is not to be accessible through the address translation.

Example 24 includes the system of any one of Examples 22 to 23, optionally in which the aperture access instruction is to be an aperture write instruction, optionally in which the aperture write instruction is to indicate a source operand, and optionally in which the processor, in response to the aperture write instruction, is to receive the data from the source operand, and is to store the data from the source operand to the host physical memory address within the aperture.

Example 25 includes the processor of any one of Examples 1 to 13, further including an optional branch prediction unit to predict branches, and an optional instruction prefetch unit, coupled with the branch prediction unit, the instruction prefetch unit to prefetch instructions including the instruction. The processor may also optionally include an optional level 1 (L1) instruction cache coupled with the instruction prefetch unit, the L1 instruction cache to store instructions, an optional L1 data cache to store data, and an optional level 2 (L2) cache to store data and instructions. The processor may also optionally include an instruction fetch unit coupled with the decode unit, the L1 instruction cache, and the L2 cache, to fetch the instruction, in some cases from one of the L1 instruction cache and the L2 cache, and to provide the instruction to the decode unit. The processor may also optionally include a register rename unit to rename registers, an optional scheduler to schedule one or more operations that have been decoded from the instruction for execution, and an optional commit unit to commit execution results of the instruction.

Example 26 includes a system-on-chip that includes at least one interconnect, the processor of any one of Examples 1 to 3 coupled with the at least one interconnect, an optional graphics processing unit (GPU) coupled with the at least one interconnect, an optional digital signal processor (DSP) coupled with the at least one interconnect, an optional display controller coupled with the at least one interconnect, an optional memory controller coupled with the at least one interconnect, an optional wireless modem coupled with the at least one interconnect, an optional image signal processor coupled with the at least one interconnect, an optional Universal Serial Bus (USB) 3.0 compatible controller coupled with the at least one interconnect, an optional Bluetooth 4.1 compatible controller coupled with the at least one interconnect, and an optional wireless transceiver controller coupled with the at least one interconnect.

Example 27 is a processor or other apparatus operative to perform the method of any one of Examples 14 to 18.

Example 28 is a processor or other apparatus that includes means for performing the method of any one of Examples 14 to 18.

Example 29 is a processor or other apparatus that includes any combination of modules and/or units and/or logic and/or circuitry and/or means operative to perform the method of any one of Examples 14 to 18.

Example 30 is an optionally non-transitory and/or tangible machine-readable medium, which optionally stores or otherwise provides instructions including a first instruction, the first instruction if and/or when executed by a processor, computer system, electronic device, or other machine, is operative to cause the machine to perform the method of any one of Examples 14 to 18.

Example 31 is a processor or other apparatus substantially as described herein.

Example 32 is a processor or other apparatus that is operative to perform any method substantially as described herein.

Example 33 is a processor or other apparatus that is operative to perform any instruction substantially as described herein.

What is claimed is:

1. A processor, comprising:

decode circuitry to decode an instruction associated with a virtualization architectural extension; and execution circuitry coupled with the decode circuitry, the execution circuitry to execute the instruction to perform operations corresponding to the instruction, including to:

access one or more access protected structures corresponding to a first virtual machine to determine a plurality of physical memory addresses associated with a corresponding plurality of apertures, including to access a first physical memory address and a second physical memory address of the plurality of physical memory addresses from a virtual machine control structure in which the first and second physical memory addresses are stored and that is to be used to store a plurality of virtual machine controls for the first virtual machine, the first physical memory address associated with a first aperture of the plurality of apertures, the second physical memory address associated with a second aperture of the plurality of apertures, wherein the first physical memory address is a host physical memory address that is accessed from the virtual machine control structure without accessing an address translation to the host physical memory address, access data in the first aperture based on the first physical memory address, wherein an opcode of the instruction allows the execution circuitry to access the one or more access protected structures to determine the first physical memory address, and wherein the second aperture is to be used by the first virtual machine to share information with a first authorized entity, and wherein the first virtual machine and the first authorized entity are to access the second aperture using the second physical memory address.

2. The processor of claim 1, the first virtual machine to use the first aperture to share information with a second authorized entity, wherein the opcode of the instruction allows the execution circuitry to access the one or more access protected structures to determine the second physical memory address, and wherein the first virtual machine and the second authorized entity are to access the first aperture using the first physical memory address.

3. The processor of claim 2, wherein at least one of the first authorized entity and the second authorized entity comprise a second virtual machine.

4. The processor of claim 2, wherein the execution circuitry is to determine a base address by reading the one or more access protected structures and is to use the base address to read the second physical memory address.

5. The processor of claim 2, wherein the first physical memory address is to indicate a first base address of the first aperture and the second physical memory address is to indicate a second base address of the second aperture.

6. The processor of claim 1, wherein the processor is to prevent access to the one or more access protected structures by one or more general-purpose memory access instructions.

7. The processor of claim 1, wherein the first authorized entity includes a second virtual machine.

8. The processor of claim 1, wherein the first virtual machine is to execute an instruction to store information in the first aperture.

9. The processor of claim 1, wherein a virtual machine monitor (VMM) is to allocate a plurality of system memory pages to the first virtual machine, at least a portion of the system memory pages to be allocated to the first aperture.

10. A method comprising:

decoding an instruction associated with a virtualization architectural extension; and executing the instruction, including:

accessing one or more access protected structures corresponding to a first virtual machine to determine a plurality of physical memory addresses associated with a corresponding plurality of apertures, including accessing a first physical memory address and a second physical memory address of the plurality of physical memory addresses from a virtual machine control structure storing the first and second physical memory addresses and storing a plurality of virtual machine controls for the first virtual machine, the first physical memory address associated with a first aperture of the plurality of apertures, the second physical memory address associated with a second aperture of the plurality of apertures, wherein the first physical memory address is a host physical memory address that is accessed from the virtual machine control structure without accessing an address translation to the host physical memory address; and the first virtual machine using the first second aperture to share information with a first authorized entity, wherein an opcode of the instruction allows access to the one or more access protected structures to determine the first physical memory address, and wherein the first virtual machine and the first authorized entity access the second aperture using the second physical memory address.

11. The method of claim 10, further comprising preventing access to the one or more access protected structures by one or more general-purpose memory access instructions.

12. The method of claim 10, further comprising the first virtual machine executing an instruction to store information in the first aperture, wherein a virtual machine monitor (VMM) is to allocate a plurality of system memory pages to the first virtual machine, at least a portion of the system memory pages to be allocated to the first aperture.

13. The method of claim 10, wherein the first physical memory address indicates a first base address of the first aperture.

14. The method of claim 10, further comprising the first virtual machine using the first aperture to share information with a second authorized entity, wherein the opcode of the instruction allows access to the one or more access protected structures to determine the second physical memory address, and wherein the first virtual machine and the second authorized entity access the first aperture using the first physical memory address.

15. The method of claim 14, further comprising:

determining a base address by reading the one or more access protected structures; and using the base address to read the second physical memory address.

16. A processor comprising:

decode circuitry to decode an instruction associated with a virtualization architectural extension; and execution circuitry coupled with the decode circuitry, the execution circuitry to execute the instruction to perform operations corresponding to the instruction, including to:

access one or more access protected structures corresponding to a first virtual machine to determine a plurality of physical memory addresses associated with a corresponding plurality of apertures, including to access a first physical memory address and a second physical memory address of the plurality of physical memory addresses from a virtual machine control structure in which the first and second physical memory addresses are stored and that is to be used to store a plurality of virtual machine controls for the first virtual machine, the first physical memory address associated with a first aperture of the plurality of apertures, the second physical memory address associated with a second aperture of the plurality of apertures, wherein the first physical memory address is a host physical memory address that is accessed from the virtual machine control structure without accessing an address translation to the host physical memory address, wherein an opcode of the instruction allows the execution circuitry to access the one or more access protected structures to determine the first physical memory address, and wherein the first virtual machine and the first authorized entity are to access the first second aperture using the first second physical memory address.

17. The processor of claim 16, wherein the processor is to prevent access to the one or more access protected structures by one or more general-purpose memory access instructions, and wherein the first virtual machine is to execute an instruction to store information in the first aperture.

18. The processor of claim 16, wherein the first physical memory address is to indicate a first base address of the first aperture, and wherein a virtual machine monitor (VMM) is to allocate a plurality of system memory pages to the first virtual machine, at least a portion of the system memory pages to be allocated to the first aperture.

* * * * *